(12) United States Patent
Ishikawa

(10) Patent No.: US 6,980,366 B2
(45) Date of Patent: Dec. 27, 2005

(54) PROJECTING EXPOSURE APPARATUS

(75) Inventor: Hiromi Ishikawa, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 6 days.

(21) Appl. No.: 10/838,224

(22) Filed: May 5, 2004

(65) Prior Publication Data
US 2004/0223229 A1 Nov. 11, 2004

(30) Foreign Application Priority Data
May 6, 2003 (JP) ............................. 2003-127893

(51) Int. Cl.[7] ............................. G02B 3/00; G02B 9/00
(52) U.S. Cl. ...................... 359/649; 359/619; 359/663
(58) Field of Search ............................. 359/663, 676, 359/679, 649–651; 355/55, 60

(56) References Cited

U.S. PATENT DOCUMENTS 5,808,986 A * 9/1998 Jewell et al. ............ 369/44.37
6,344,929 B1 * 2/2002 Sugawara ................... 359/622
6,433,934 B1 * 8/2002 Reznichenko et al. ...... 359/622

FOREIGN PATENT DOCUMENTS
JP 2001-305663 A 11/2001

* cited by examiner

Primary Examiner—Jordan M. Schwartz
(74) Attorney, Agent, or Firm—Sughrue Mion, PLLC

(57) ABSTRACT

A spatial light modulator has pixel sections for performing spatial light modulation of light. An image-side telecentric image forming optical system forms an image of a two-dimensional pattern of the light having been obtained from the spatial light modulation. A microlens array having microlenses arrayed in two-dimensional directions is located in the vicinity of a plane of image formation of the two-dimensional pattern, whose image is formed by the image forming optical system. A magnification adjusting optical system for adjusting a magnification of image formation at the time of the formation of the image of the two-dimensional pattern of the light with the image forming optical system is located between the image forming optical system and the microlens array.

10 Claims, 18 Drawing Sheets

| | RADIUS OF CURVATURE | DISTANCE | MATERIAL |
|---|---|---|---|
| DND | | 15.31 | |
| PLANE-PARALLEL PLATE(TIR PRISM) | | 17.00 | BSL7Y |
| | | 5.000 | |
| LENS 1 (LENS 51A) | 59.770 | 10.31 | PBM2Y |
| | 38.069 | 0.2065 | |
| LENS 2 (LENS 51B) | 37.721 | 12.21 | SFSL5Y |
| | -61.798 | 1.207 | |
| LENS 3 (LENS 51C) | 43.118 | 3.588 | PBM2Y |
| | 29.282 | 0.6382 | |
| LENS 4 (LENS 51D) | 34.258 | 7.171 | SFSL5Y |
| | -170.51 | 0.2074 | |
| LENS 5 (LENS 51E) | 27.198 | 5.779 | BSL7Y |
| | 93.424 | 0.20 | |
| LENS 6 (LENS 51F) | 17.986 | 10.30 | PBM2Y |
| | 8.893 | 10.35 | |
| LENS 7 (LENS 51G) | -29.171 | 8.682 | SFSL5Y |
| | -11.978 | 0.2179 | |
| LENS 8 (LENS 51H) | -14.293 | 8.344 | PBM8Y |
| | 114.75 | 4.970 | |
| LENS 9 (LENS 51I) | 6648 | 9.162 | BSL7Y |
| | 166.58 | 0.8985 | |
| LENS 10 (LENS 51J) | 228.39 | 14.95 | SFSL5Y |
| | -28.196 | 0.6256 | |
| LENS 11 (LENS 51K) | -29.425 | 14.99 | PBM2Y |
| | -42.675 | 14.44 | |
| LENS 12 (LENS 51L) | -1163.4 | 15.00 | BSL7Y |
| | -184.2 | 14.82 | |
| LENS 13 (LENS 51M) | 116.0 | 6.387 | BSM51Y |
| | 1320.1 | 15.00 | |
| CONCAVE LENS 53U | -474.4 | 5.00 | BSL7Y |
| | 17646.3 | 15.00 | |
| CONVEX LENS 53H | 17185.9 | 5.00 | BSL7Y |
| | -474.8 | 110.86 | |

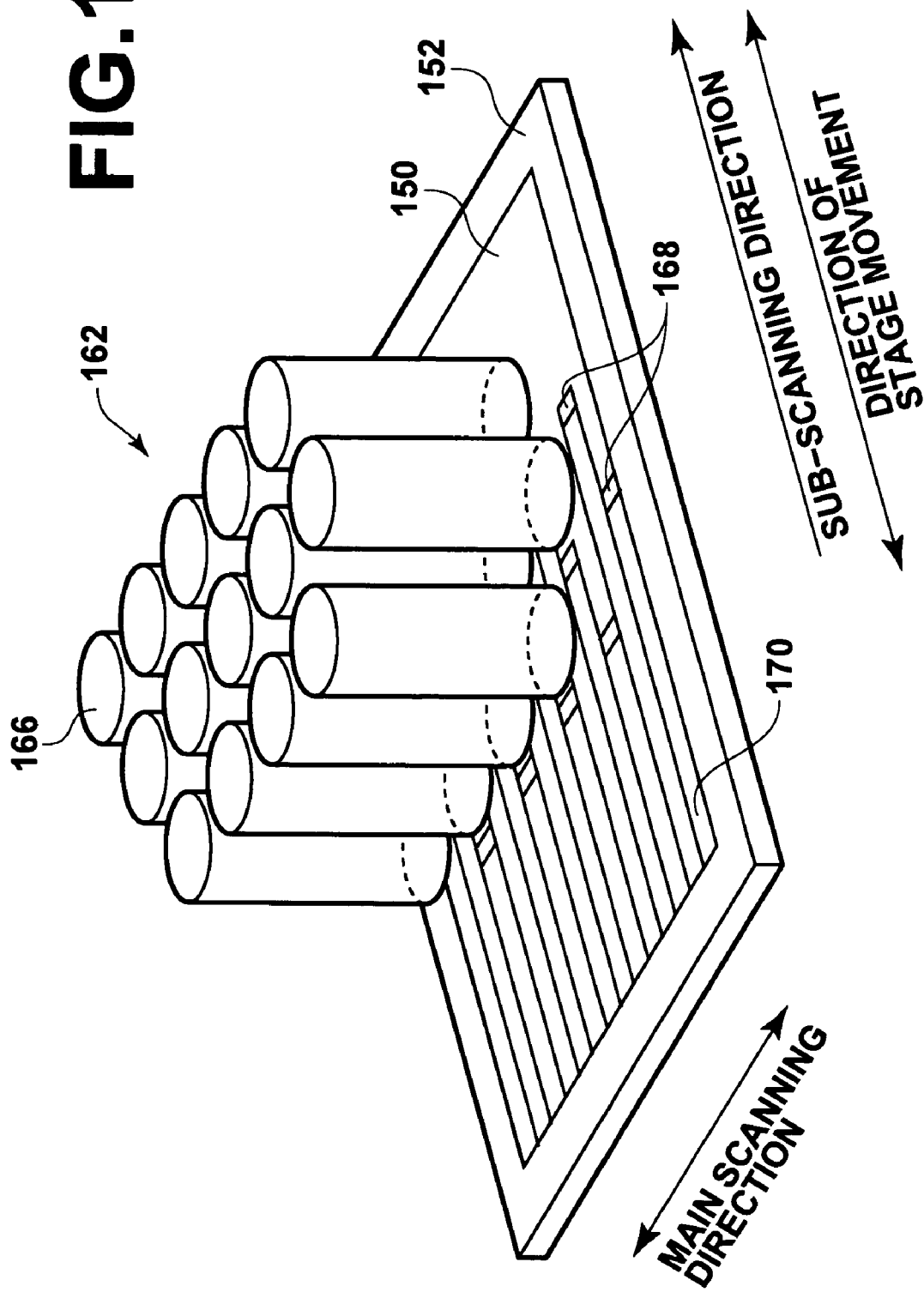

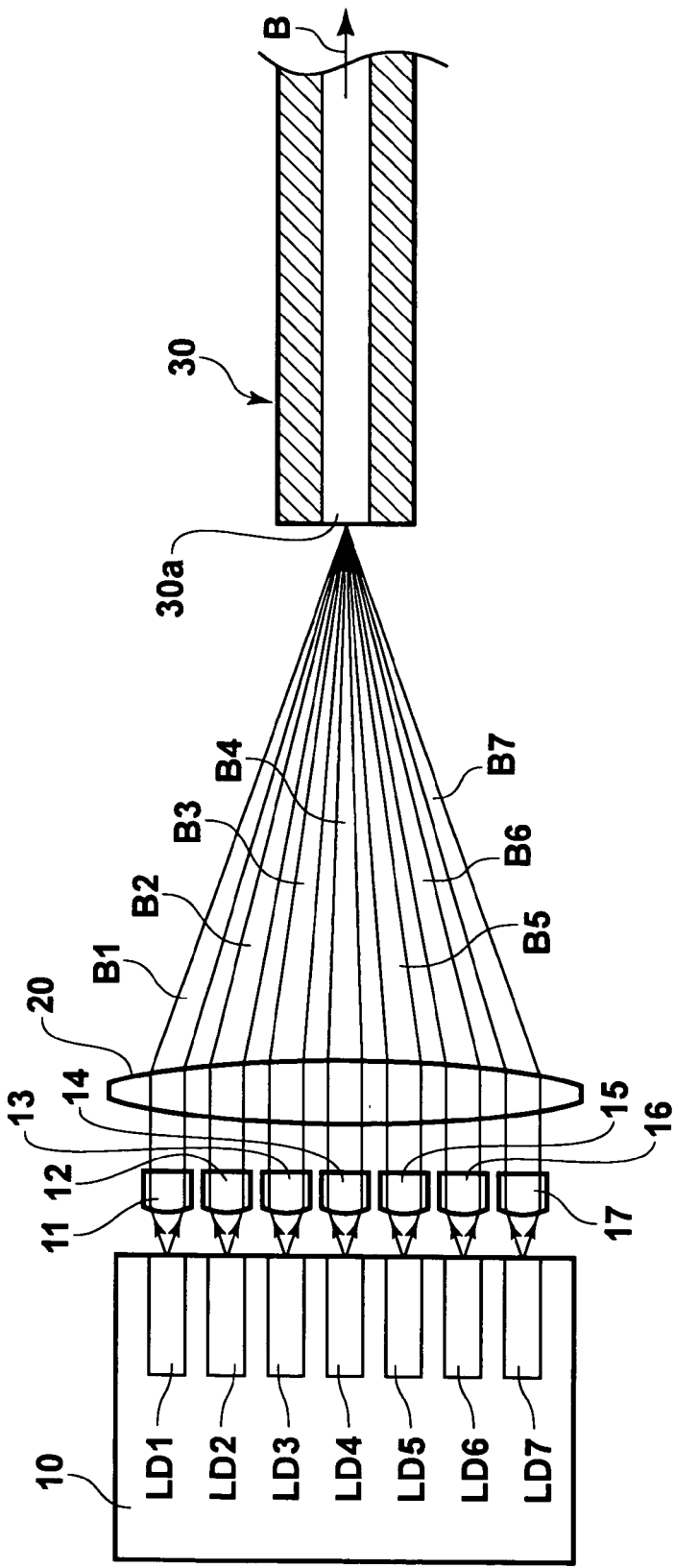

PROJECTING EXPOSURE APPARATUS

BACKGROUND OF THE INVENTION

1. Field of the Invention

This invention relates to a projecting exposure apparatus. This invention particularly relates to a projecting exposure apparatus, wherein a two-dimensional pattern of light having been obtained from spatial light modulation is projected through a telecentric image forming optical system onto a photosensitive material, and the photosensitive material is thus exposed to the two-dimensional pattern of the light.

2. Description of the Related Art

Projecting exposure apparatuses, wherein spatial light modulation means for performing spatial light modulation of incident light in accordance with a predetermined control signal is utilized, a two-dimensional pattern of the light, which has been obtained from the spatial light modulation performed by the spatial light modulation means, is projected onto a photosensitive material, and the photosensitive material is thus exposed to the two-dimensional pattern of the light, have heretofore been known. Also, projecting exposure apparatuses, wherein a digital micromirror device (hereinbelow referred to as the DMD) comprising a plurality of (e.g., 1,024×756) micromirrors, which allow alteration of their inclination angles and which are arrayed in a two-dimensional pattern, is utilized as the spatial light modulation means, have heretofore been known. (The projecting exposure apparatuses, wherein the digital micromirror device (DMD) is utilized as the spatial light modulation means, are described in, for example, Patent Literature 1.) As the digital micromirror device (DMD), for example, a DMD supplied by Texas Instruments Co. has been known. Projectors for dynamic images, wherein the DMD is utilized, and the like, have been used in practice.

The projecting exposure apparatuses utilizing the DMD are provided with an image forming optical system for forming an image of each of the micromirrors of the DMD on the photosensitive material. With the projecting exposure apparatuses utilizing the DMD, the images of only the light, which has been reflected from certain micromirrors inclined at predetermined angles among the micromirrors that receive the irradiated light for exposure, and which travels toward the image forming optical system, are formed through the image forming optical system. In this manner, the two-dimensional pattern having been formed by the micromirrors is projected onto the photosensitive material, and the photosensitive material is thus exposed to the two-dimensional pattern. Specifically, with the projecting exposure apparatuses utilizing the DMD, the exposure operation is performed such that each of pixels constituting the image of the two-dimensional pattern corresponds to one of the micromirrors.

The projecting exposure apparatuses described above is provided with an exposure head for irradiating the two-dimensional pattern to the photosensitive material. By way of example, as illustrated in FIG. 20, optical elements constituting the exposure head include a DMD 80J, and a light source unit 60J for producing the light to be irradiated to the DMD 80J. The optical elements constituting the exposure head also include a DMD irradiation optical system 70J provided with a total reflection prism 76J for receiving the light, which has been radiated out from the light source unit 60J, and totally reflecting the light toward the DMD 80J, and an optical system 50J for forming an image of the two-dimensional pattern of the light, which has been obtained from spatial light modulation performed by the DMD 80J, on a photosensitive material 150J.

The optical system 50J described above comprises a first image forming optical system 51J. The optical system 50J also comprises a second image forming optical system 52J for relaying the image of the two-dimensional pattern, which image has been formed by the first image forming optical system 51J, and forming the image of the two-dimensional pattern on the photosensitive material 150J. The optical system 50J further comprises a microlens array 55J and an aperture array 59J, which are located in the optical path between the first image forming optical system 51J and the second image forming optical system 52J.

The microlens array 55J described above is constituted of a plurality of microlenses 55Ja, 55Ja, . . . Each of the microlenses 55Ja, 55Ja, . . . is located at a position corresponding to one of micromirrors 81J, 81J, . . . of the DMD 80J, such that the microlens 55Ja transmits and converges a telecentric light beam Lj corresponding to one of the micromirrors 81J, 81J, . . . , which light beam has been reflected from the corresponding micromirror 81J of the DMD 80J and has passed through the first image forming optical system 51J. Also, the aperture array 59J comprises a plurality of apertures 59Ja, 59Ja, . . . Each of the apertures 59Ja, 59Ja, . . . is located at a position corresponding to one of the microlenses 55Ja, 55Ja, . . . of the microlens array 55J, such that the aperture 59Ja allows the passage of the light beam, which has passed through the corresponding microlens 55Ja of the microlens array 55J.

In the optical system 50J having the constitution described above, each of telecentric light beams Lj, Lj, . . . corresponding respectively to the micromirrors 81J, 81J, . . . of the DMD 80J, which light beam has passed through the first image forming optical system 51J after being reflected from the corresponding micromirror 81J, is collected by the corresponding microlens 55Ja of the microlens array 55J, which is located on the side of the first image forming optical system 51J and in the vicinity of the position of image formation with the first image forming optical system 51J. Each of the light beams Lj, Lj, . . . , which light beam has thus been collected by the corresponding microlens 55Ja, passes through the corresponding aperture 59Ja.

Each of the light beams Lj, Lj, . . . , the image of which light beam has been formed by the first image forming optical system 51J, passes through the microlens array 55J and the aperture array 59J. Each of the light beams Lj, Lj, . . . is then relayed by the second image forming optical system 52J, and the image of the light beam Lj is formed on the photosensitive material 150J. In this manner, the two-dimensional pattern is projected onto the photosensitive material 150J, and the photosensitive material 150J is thus exposed to the two-dimensional pattern.

In cases where each of pixels constituting the image of the two-dimensional pattern, i.e. each of the light beams Lj, Lj, . . . , which have passed through the corresponding microlenses 55Ja, 55Ja, . . . after being reflected from the corresponding micromirrors 81J, 81J, . . . , undergoes thickening due to aberrations of the optical elements described above, and the like, the light beam Lj is capable of being shaped by the corresponding aperture 59Ja such that the spot size on the photosensitive material 150J becomes identical with a predetermined size. Also, as described above, each of the light beams Lj, Lj, . . . , which light beam has been reflected from one of the micromirrors 81J, 81J, . . . is passed through the aperture 59Ja, which corresponds to the micromirror 81J. Therefore, cross talk between the micromirrors 81J, 81J, . . . (i.e., between the pixels constituting the image of the two-dimensional pattern) is capable of being prevented from occurring, and the extinction ratio in on-off operations of each of the micromirrors 81J, 81J, . . . at the time of the exposure operation is capable of being enhanced. Accordingly, the contrast of the two-dimensional pattern projected onto the photosensitive material 150J is capable of being kept high, and the quality of the exposure operation is capable of being enhanced.

The state, in which each of the micromirrors 81J, 81J, . . . is inclined at the predetermined angle such that the light beam having been reflected from the micromirror 81J travels toward the optical system 50J, is the on state of the micromirror 81J. Also, the state, in which each of the micromirrors 81J, 81J, . . . is inclined at an angle different from the predetermined angle such that the light beam having been reflected from the micromirror 81J travels along a direction shifted from the direction of the optical path heading toward the optical system 50J, is the off state of the micromirror 81J. The image of the light beam, which has been reflected from the micromirror 81J in the on state, is formed on the photosensitive material 150J, and the photosensitive material 150J is thus exposed to the light beam. Therefore, the extinction ratio may be defined as the ratio of the brightness of the pixel region corresponding to a micromirror 81J, which pixel region is formed on the photosensitive material 150J when the micromirror 81J is set in the off state, to the brightness of the pixel region corresponding to the micromirror 81J, which pixel region is formed as an image on the photosensitive material 150J when the micromirror 81J is set in the on state.

[Patent Literature 1]
Japanese Unexamined Patent Publication No. 2001-305663

However, there is a strong demand for a projecting exposure apparatus, wherein the extinction ratio and the exposure quality are capable of being enhanced even further. In order for the extinction ratio and the exposure quality to be enhanced even further, for example, it is required that each of the telecentric light beams Lj, Lj, . . . , which light beam has passed through the first image forming optical system 51J after being reflected from the corresponding micromirror 81J among, for example, 1,024×256 (approximately 260,000) micromirrors 81J, 81J, . . . constituting the DMD 80J in the constitution described above, is capable of being transmitted more accurately through a microlens 55Ja among the 1,024×256 microlenses 55Ja, 55Ja, . . . , which microlens 55Ja corresponds to the micromirror 81J, and an aperture 59Ja among the 1,024×256 apertures 59Ja, 59Ja, . . . , which aperture 59Ja corresponds to the micromirror 81J, and that the image of the telecentric light beam Lj is thus capable of being formed. Specifically, it is necessary that the pitches among the approximately 260,000 telecentric light beams Lj, Lj, . . . , each of which travels to one of the microlenses 55Ja, 55Ja, . . . and one of the apertures 59Ja, 59Ja, . . . , are capable of being set to coincide with the pitches among the same number of the corresponding microlenses 55Ja, 55Ja, and the pitches among the same number of the corresponding apertures 59Ja, 59Ja, . . . , and that the thickening of each of the telecentric light beams Lj, Lj, . . . and errors in parallelism of the telecentric light beams Lj, Lj, . . . with respect to one another are capable of being suppressed. For such purposes, it is desired that the characteristics of the first image forming optical system 51J, such as modulation transfer function (MTF) performance (suppression of the thickening of the light beams), telecentric characteristics (parallelism of the light beams with respect to one another), distortion performance (equi-pitch characteristics), and the accuracy of the magnification of image formation, are capable of being enhanced to predetermined characteristics such that the desired exposure quality is capable of being obtained.

However, the characteristics described above (i.e., the MTF performance, the telecentric characteristics, the distortion performance, and the accuracy of the magnification of image formation) have correlations with one another. For example, if the accuracy of the magnification of image formation is enhanced, it will occur that the MTF performance and the distortion performance become bad. Therefore, the problems occur in that the first image forming optical system 51J cannot always be produced such that all of the characteristics described above become identical with at least the predetermined characteristics.

SUMMARY OF THE INVENTION

The primary object of the present invention is to provide a projecting exposure apparatus, wherein an extinction ratio of a two-dimensional pattern of light to be projected onto a photosensitive material is capable of being enhanced, and exposure quality is thereby capable of being enhanced.

Another object of the present invention is to provide a projecting exposure apparatus, wherein adjustments for enhancing an extinction ratio of a two-dimensional pattern of light to be projected onto a photosensitive material is capable of being performed easily.

The present invention provides a projecting exposure apparatus, comprising:
  i) spatial light modulation means provided with a plurality of pixel sections arrayed in two-dimensional directions, which pixel sections modulate incident light in accordance with a predetermined control signal, the spatial light modulation means performing spatial light modulation of the light with the plurality of the pixel sections,
  ii) an image-side telecentric image forming optical system for forming an image of a two-dimensional pattern of the light, which has been obtained from the spatial light modulation performed by the spatial light modulation means, and
  iii) a microlens array located in the vicinity of a plane of image formation of the two-dimensional pattern, whose image is formed by the image-side telecentric image forming optical system, the microlens array being provided with a plurality of microlenses arrayed in two-dimensional directions, each of which microlenses transmits one of light beams corresponding respectively to the pixel sections of the spatial light modulation means and having passed through the image-side telecentric image forming optical system,
  the two-dimensional pattern of the light being projected onto the photosensitive material, the photosensitive material being thus exposed to the two-dimensional pattern of the light,
  wherein the projecting exposure apparatus further comprises a magnification adjusting optical system, which is located between the image-side telecentric image forming optical system and the microlens array, and which adjusts a magnification of image formation at the time of the formation of the image of the two-dimensional pattern of the light with the image-side telecentric image forming optical system.

The projecting exposure apparatus in accordance with the present invention may be modified such that the magnification adjusting optical system is constituted of a combination of a concave lens and a convex lens.

Also, the projecting exposure apparatus in accordance with the present invention may be modified such that the magnification adjusting optical system is constituted of a combination of a concave lens and a convex lens, and each of a focal length of the concave lens and a focal length of the convex lens is equal to at least 800 mm.

Further, the projecting exposure apparatus in accordance with the present invention may be modified such that a value of a ratio of a focal length of the convex lens to a focal length of the concave lens is equal to approximately 1.

As described above, the value of the ratio of the focal length of the convex lens to the focal length of the concave lens may be set to be equal to approximately 1. Specifically, the value of the ratio of the focal length of the convex lens to the focal length of the concave lens may be set at a value close to 1 such that the desired telecentric characteristics are capable of being obtained.

Furthermore, the projecting exposure apparatus in accordance with the present invention may be modified such that the magnification adjusting optical system also acts as a distortion correcting optical system for correcting a distortion occurring at the time of the formation of the image of the two-dimensional pattern of the light with the image-side telecentric image forming optical system.

By way of example, the magnification adjusting optical system, which also acts as the distortion correcting optical system, may be constituted such that at least either one of the concave lens and the convex lens of the magnification adjusting optical system is moved in a direction which is normal to the optical axis of the image-side telecentric image forming optical system, and the distortion is thereby corrected.

The two-dimensional pattern of the light may represent an image to be displayed. Alternatively, the two-dimensional pattern of the light may represent an electric wiring circuit pattern, or the like.

The photosensitive material may be a board for the formation of a printed circuit board, which board is provided with a photosensitive material layer for forming an electric wiring pattern acting as the two-dimensional pattern. Alternatively, the photosensitive material may be a base plate for the formation of a liquid crystal display panel or a plasma display panel, which base plate is provided with a photosensitive material layer for forming an electric wiring pattern.

The projecting exposure apparatus in accordance with the present invention comprises the image-side telecentric image forming optical system for forming the image of the two-dimensional pattern of the light, which has been obtained from the spatial light modulation performed by the spatial light modulation means, and the microlens array. The projecting exposure apparatus in accordance with the present invention also comprises the magnification adjusting optical system, which is located between the image-side telecentric image forming optical system and the microlens array, and which adjusts the magnification of image formation of the two-dimensional pattern at the time of the formation of the image of the two-dimensional pattern of the light with the image-side telecentric image forming optical system. Therefore, the magnification of image formation is capable of being altered separately from the MTF performance, the telecentric characteristics, the distortion performance, and the like, of the image forming optical system. The magnification of image formation is capable of being adjusted such that the MTF performance, the telecentric characteristics, the distortion performance, and the like, may not become bad, and each of the light beams is capable of being transmitted more accurately to the corresponding microlens. Accordingly, the extinction ratio at each of the pixels constituting the image of the two-dimensional pattern projected onto the photosensitive material is capable of being enhanced, and good exposure quality is capable of being obtained.

With the projecting exposure apparatus in accordance with the present invention, wherein the magnification adjusting optical system is constituted of the combination of the concave lens and the convex lens, the certainty that the magnification of image formation is capable of being altered separately from the MTF performance, the telecentric characteristics, the distortion performance, and the like, of the image forming optical system is capable of being enhanced even further. Therefore, the adjustment of the magnification of image formation for the enhancement of the extinction ratio is capable of being performed more easily.

Also, the projecting exposure apparatus in accordance with the present invention may be modified such that the magnification adjusting optical system is constituted of the combination of the concave lens and the convex lens, and each of the focal length of the concave lens and the focal length of the convex lens is equal to at least 800 mm. With the modification described above, the certainty that the magnification of image formation is capable of being altered separately from the MTF performance, the telecentric characteristics, the distortion performance, and the like, of the image forming optical system is capable of being enhanced even further. Also, in cases where the adjustment of the magnification of image formation is performed with the movement of at least either one of the concave lens and the convex lens along the direction of the optical axis of the image forming optical system, the degree of the alteration of the magnification of image formation with respect to the distance of movement of the concave lens or the convex lens is capable of being set to be low. Specifically, the sensitivity of the adjustment of the magnification of image formation is capable of being set to be low. Therefore, the accuracy with which the magnification of image formation is adjusted is capable of being enhanced.

With the projecting exposure apparatus in accordance with the present invention, wherein the value of the ratio of the focal length of the convex lens to the focal length of the concave lens is equal to approximately 1, the certainty that the magnification of image formation is capable of being altered separately from the MTF performance, the telecentric characteristics, the distortion performance, and the like, of the image forming optical system is capable of being enhanced even further.

Also, the projecting exposure apparatus in accordance with the present invention may be modified such that the magnification adjusting optical system also acts as the distortion correcting optical system for correcting the distortion occurring at the time of the formation of the image of the two-dimensional pattern of the light with the image-side telecentric image forming optical system. With the modification described above, the adjustment of the magnification of image formation for the enhancement of the extinction ratio and the correction of the distortion are capable of being performed more easily. For example, the adjustment of the magnification of image formation may be performed with the movement of at least either one of the concave lens and the convex lens of the magnification adjusting optical system along the direction of the optical axis of the image forming optical system, and the correction of the distortion may be performed with the movement of at least either one of the concave lens and the convex lens of the magnification adjusting optical system along the direction which is normal to the optical axis of the image-side telecentric image forming optical system. In this manner, the adjustment of the magnification of image formation and the correction of the distortion are capable of being performed separately from each other. Therefore, the adjustment for the enhancement of the extinction ratio is capable of being performed more easily.

BRIEF DESCRIPTION OF THE DRAWINGS

FIG. 10 is a perspective view showing how an exposure operation is performed by the projecting exposure apparatus of FIG. 9, FIG. 15 is an enlarged plan view showing optical elements of the laser beam combining light source.

DESCRIPTION OF THE PREFERRED EMBODIMENTS

The present invention will hereinbelow be described in further detail with reference to the accompanying drawings.

Figure 1:
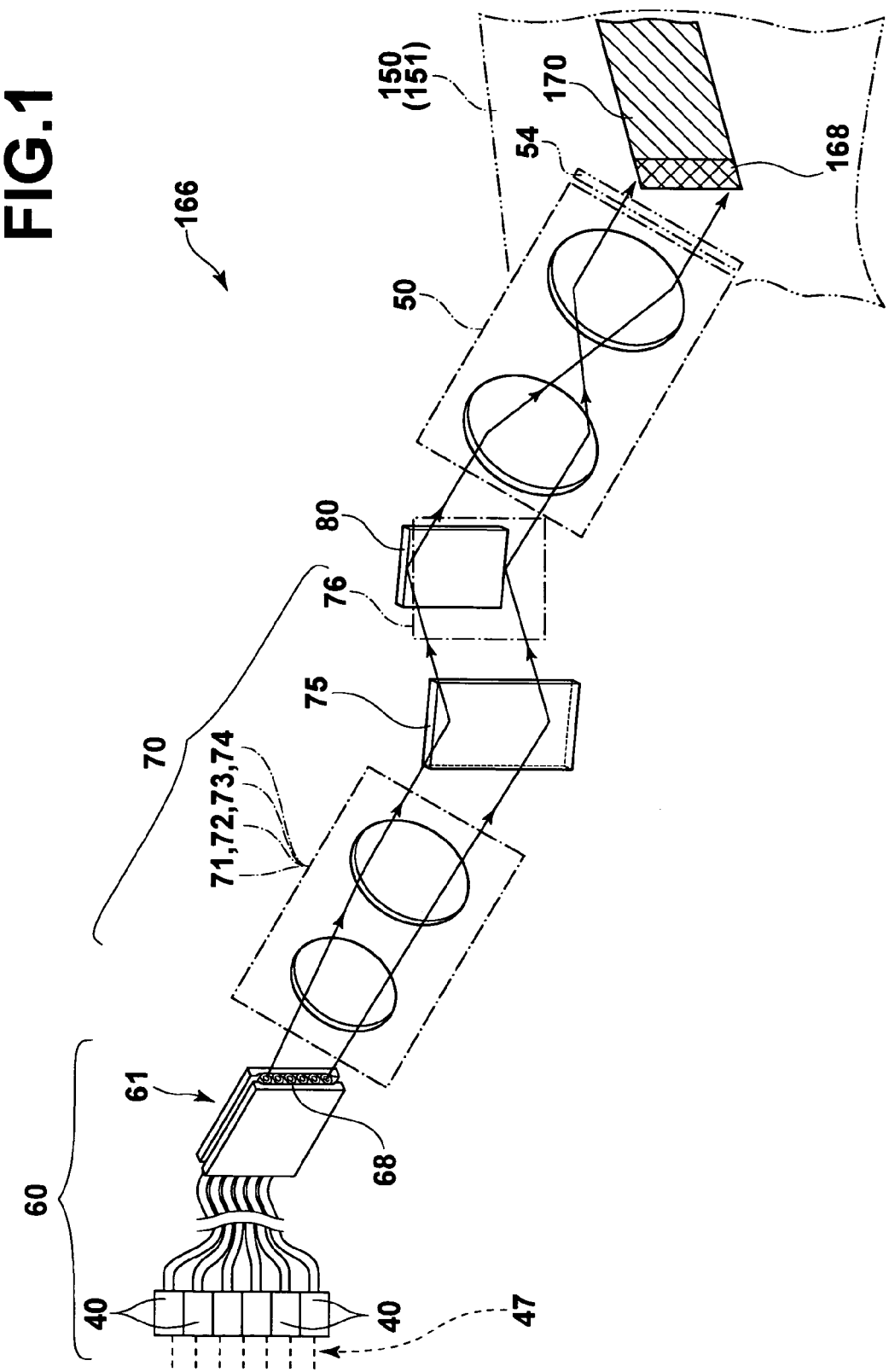
FIG. 1 is a developed conceptual view showing an exposure head in an embodiment of the projecting exposure apparatus in accordance with the present invention.
Figure 2:
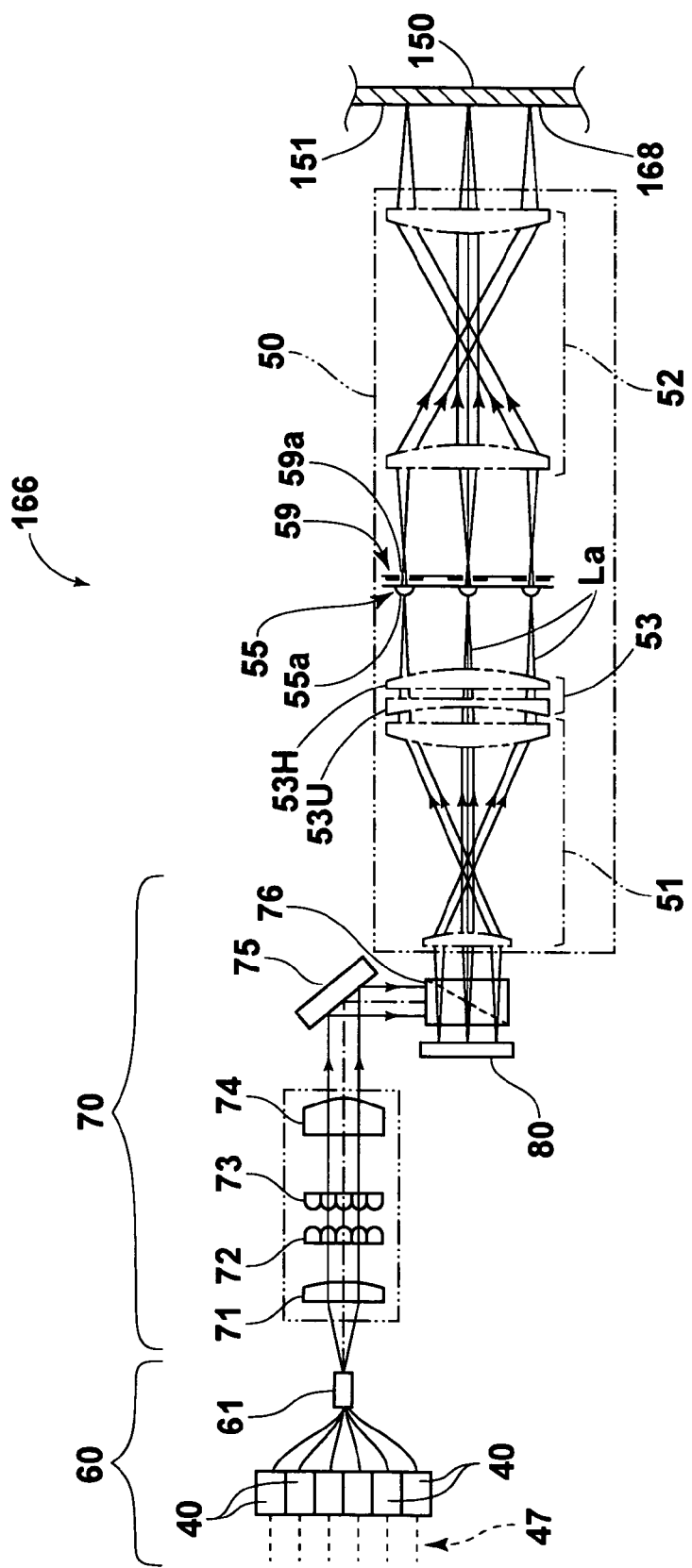
FIG. 2 is a side view showing a constitution of the exposure head along optical paths of light beams traveling through the exposure head.
Figure 3:
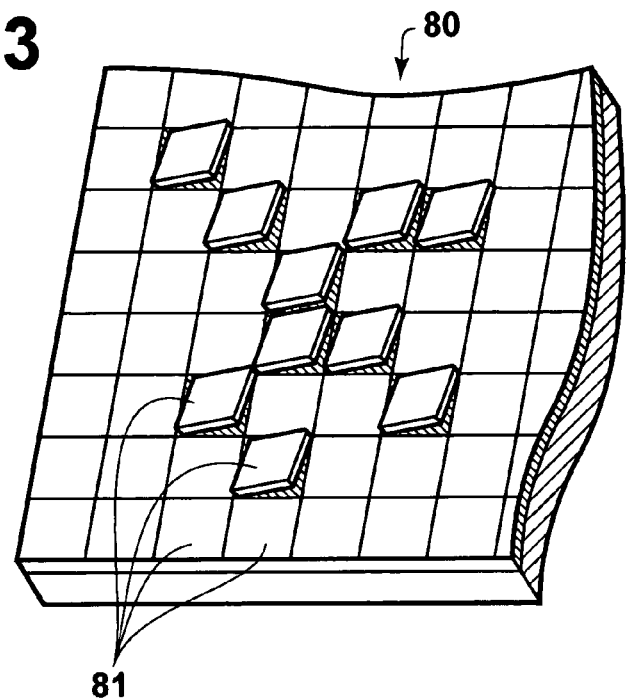
FIG. 3 is a perspective view showing a DMD.

FIG. 1 is a developed conceptual view showing an exposure head of an embodiment of the projecting exposure apparatus in accordance with the present invention. FIG. 2 is a side view showing a constitution of the exposure head along optical paths of light beams traveling through the exposure head. FIG. 3 is a perspective view showing a DMD.

The embodiment of the projecting exposure apparatus in accordance with the present invention comprises a DMD 80 constituted of a plurality of micromirrors 81, 81, . . ., which are arrayed in two-dimensional directions. Each of the micromirrors 81, 81, . . . acts as one of the pixel sections for modulating incident light, which has been produced by a light source unit 60 acting as the light source and has then passed through a DMD irradiation optical system 70, in accordance with a predetermined control signal. The DMD 80 acts as the spatial light modulation means for performing spatial light modulation of the light with the micromirrors 81, 81, The projecting exposure apparatus also comprises a first image forming optical system 51 acting as the image-side telecentric image forming optical system for forming an image of a two-dimensional pattern of the light, which has been obtained from the spatial light modulation performed by the DMD 80. The projecting exposure apparatus further comprises a microlens array 55 located in the vicinity of a plane of image formation of the two-dimensional pattern, whose image is formed by the first image forming optical system 51, and on the side of the first image forming optical system 51. The microlens array 55 is provided with a plurality of microlenses 55*a*, 55*a*, . . . arrayed in two-dimensional directions, each of which microlenses transmits and converges one of light beams corresponding respectively to the micromirrors 81, 81, . . . and having passed through the first image forming optical system 51. The projecting exposure apparatus still further comprises a magnification adjusting optical system 53, which is located between the first image forming optical system 51 and the microlens array 55, and which adjusts a magnification of image formation at the time of the formation of the image of the two-dimensional pattern of the light with the first image forming optical system 51. With the projecting exposure apparatus, the two-dimensional pattern of the light is projected onto a photosensitive material 150, and the photosensitive material 150 is thus exposed to the two-dimensional pattern of the light. Each of the micromirrors 81, 81, . . . acting as the pixel sections deflects the light, which has been produced by the light source unit 60 acting as the light source and has then passed through the DMD irradiation optical system 70, in accordance with the predetermined control signal.

The light source unit 60, the DMD 80, the first image forming optical system 51, the magnification adjusting optical system 53, the microlens array 55, and the like, are optical elements constituting an exposure head 166, which will be described later. By way of example, the two-dimensional pattern may represent a wiring pattern of an electric circuit. Also, the photosensitive material 150 maybe, for example, an electric circuit board having a surface, on which a photoresist has been coated.

As illustrated in FIG. 2, an optical system 50, which is one of the optical elements constituting the exposure head 166, comprises the first image forming optical system 51. The optical system 50 also comprises a second image forming optical system 52 for relaying the image of the two-dimensional pattern, which image has been formed by the first image forming optical system 51, and forming the image of the two-dimensional pattern on the photosensitive material 150. The optical system 50 further comprises the magnification adjusting optical system 53, the microlens array 55, an aperture array 59, and the like, which are located in the optical paths between the first image forming optical system 51 and the second image forming optical system 52.

The microlens array 55 is constituted of the plurality of the microlenses 55a, 55a, ... Each of the microlenses 55a, 55a, ... is located at a position corresponding to one of the micromirrors 81, 81, ... of the DMD 80 (illustrated in FIG. 3), such that the microlens 55a transmits the light beam having been reflected from the corresponding micromirror 81 of the DMD 80 and having then passed through the first image forming optical system 51 and the magnification adjusting optical system 53.

Also, the aperture array 59 comprises a plurality of apertures 59a, 59a, ... Each of the apertures 59a, 59a, ... is located at a position corresponding to one of the microlenses 55a, 55a, ... of the microlens array 55, such that the aperture 59a allows the passage of the light beam, which has passed through the corresponding microlens 55a of the microlens array 55.

The magnification adjusting optical system 53 is constituted of a combination of a concave lens 53U and a convex lens 53H. The concave lens 53U and the convex lens 53H are constituted such that each of the focal length of the concave lens 53U and the focal length of the convex lens 53H is equal to at least 800 mm, and the value of the ratio of the focal length of the convex lens 53H to the focal length of the concave lens 53U is equal to approximately 1. The magnification adjusting optical system 53 also acts as the distortion correcting optical system for correcting the distortion occurring at the time of the formation of the image of the two-dimensional pattern of the light with the first image forming optical system 51.

In the optical system 50 having the constitution described above, the image of the micromirrors 81, 81, ..., which image is formed with the light beams having been reflected from the micromirrors 81, 81, ... of the DMD 80, is enlarged by the first image forming optical system 51 to a size three times as large as the size of the original image. Each of telecentric light beams La, La, ... corresponding respectively to the micromirrors 81, 81, ..., which light beam has passed through the first image forming optical system 51 after being reflected from the corresponding micromirror 81, is collected by the corresponding microlens 55a of the microlens array 55, which is located in the vicinity of the position of image formation with the first image forming optical system 51. Each of the light beams La, La, ..., which light beam has thus been collected by the corresponding microlens 55a, passes through the corresponding aperture 59a. The size of the image constituted of the light beams La, La, ..., which have passed through the microlens array 55 and the aperture array 59, is enlarged even further by the second image forming optical system 52 by a factor of 1.67. The image constituted of the light beams La, La, ..., which image has the thus enlarged size is formed on a photosensitive surface 151 of the photosensitive material 150.

In cases where each of pixels constituting the image of the two-dimensional pattern, i.e. each of the light beams La, La, ..., which have passed through the corresponding microlenses 55a, 55a, ..., after being reflected from the corresponding micromirrors 81, 81, ..., undergoes thickening due to aberrations of the optical elements described above, and the like, the light beam La is capable of being shaped by the corresponding aperture 59a such that the spot size on the photosensitive surface 151 becomes identical with a predetermined size. Also, as described above, each of the light beams La, La, ..., which light beam has been reflected from one of the micromirrors 81, 81, ... is passed through the aperture 59a, which corresponds to the micromirror 81. Therefore, cross talk between the micromirrors 81, 81, ... (the pixels) is capable of being prevented from occurring, and the extinction ratio in on-off operations of each of the micromirrors 81, 81, ... at the time of the exposure operation is capable of being enhanced.

The state, in which each of the micromirrors 81, 81, ... is inclined at the predetermined angle such that the light beam having been reflected from the micromirror 81 travels toward the optical system 50, is the on state of the micromirror 81. Also, the state, in which each of the micromirrors 81, 81, ... is inclined at an angle different from the predetermined angle such that the light beam having been reflected from the micromirror 81 travels along a direction shifted from the direction of the optical path heading toward the optical system 50, is the off state of the micromirror 81. The image of the light beam, which has been reflected from the micromirror 81 in the on state, is formed on the photosensitive surface 151, and the photosensitive material 150 is thus exposed to the light beam. Specifically, each of the micromirrors 81, 81, ... modulates the incident light in accordance with the alteration of the angle of inclination of the micromirror 81. Also, the DMD 80 alters the angle of inclination of each of the micromirrors 81, 81, ... in accordance with a predetermined control signal and thereby performs the spatial light modulation of the incident light.

Figures 4A, 4B:
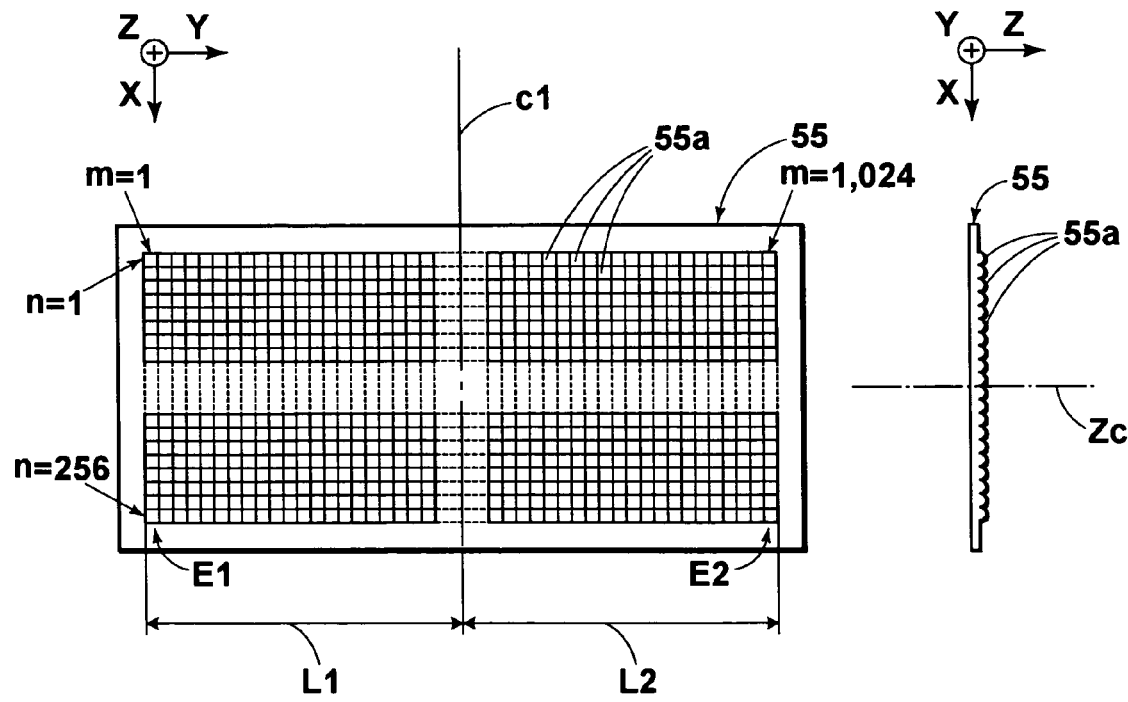
FIG. 4A is a front view showing a microlens array, the view being taken from the direction of an optical axis of a first image forming optical system.
FIG. 4B is a side view showing the microlens array.
Figure 5:
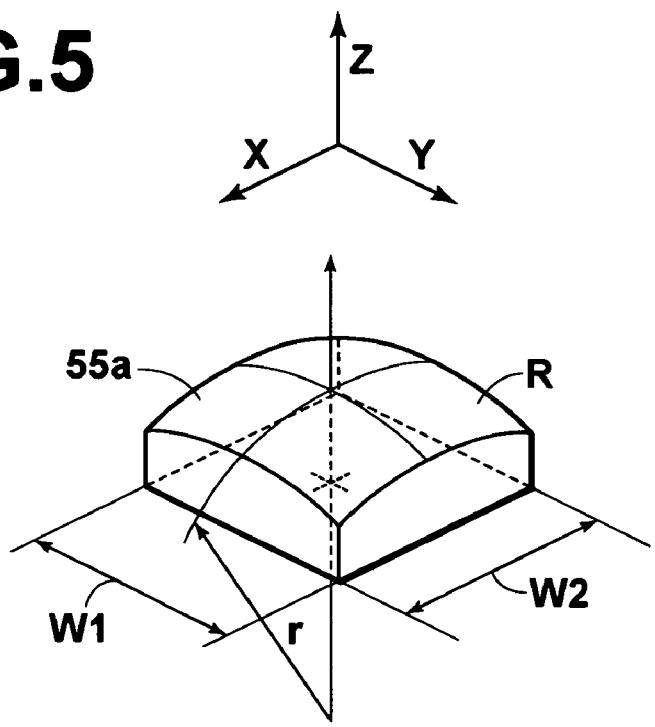
FIG. 5 is an enlarged perspective view showing a microlens.
Figure 6:
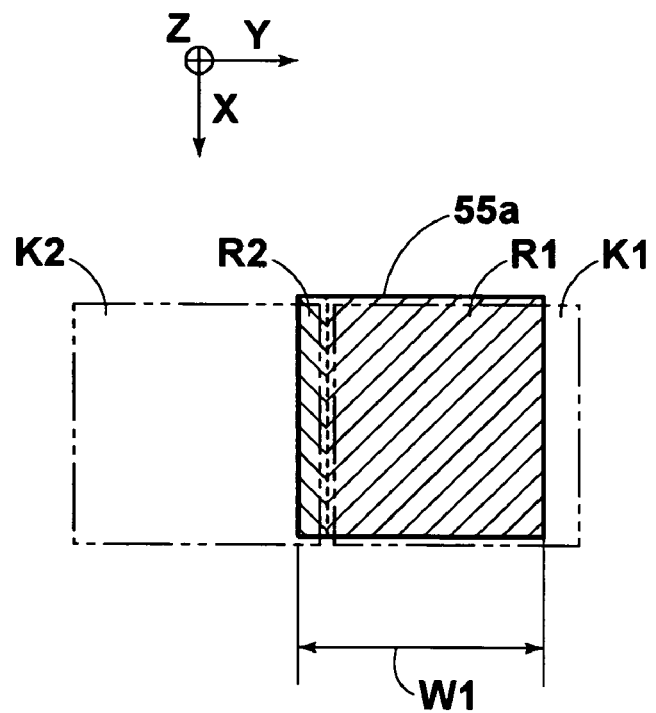
FIG. 6 is a front view showing how light beams impinge upon the microlens.

How the magnification of image formation at the time of the formation of the image of the two-dimensional pattern of the light with the first image forming optical system 51 is adjusted by use of the magnification adjusting optical system 53, how the distortion is corrected by use of the magnification adjusting optical system 53, and how the extinction ratio is enhanced by use of the magnification adjusting optical system 53 will be described hereinbelow. FIG. 4A is a front view showing a microlens array, the view being taken from the direction of an optical axis of a first image forming optical system. FIG. 4B is a side view showing the microlens array. FIG. 5 is an enlarged perspective view showing a microlens. FIG. 6 is a front view showing how light beams impinge upon the microlens.

Firstly, the relationship between the extinction ratio and the accuracy of the magnification adjustment will be described hereinbelow.

As illustrated in FIGS. 4A and 4B, the microlens array 55 is provided with 1,024×256 microlenses 55a, 55a, . . . , which are arrayed in a matrix form constituted of m columns (where m=1 to 1,024) and n rows (where n=1 to 256). Specifically, in the array of the microlenses 55a, 55a, . . . , 1,024 microlenses 55a, 55a, . . . are arrayed in a Y direction, which is normal to an optical axis Zc extending in a Z direction of the first image forming optical system 51, and 256 microlenses 55a, 55a, . . . are arrayed in an X direction, which is normal to the Z direction and the Y direction. As illustrated in FIG. 5, a width W1 of each of the microlenses 55a, 55a, . . . , which width is taken along the Y direction, is equal to 0.0410 mm. A width W2 of each of the microlenses 55a, 55a, which width is taken along the X direction, is equal to 0.0410 mm. Also, a radius of curvature "r" of a lens surface R of each of the microlenses 55a, 55a, . . . is equal to 0.10 mm. The material constituting the microlens array 55 is glass (BK7).

The length, over which the 1,024 microlenses 55a, 55a, are arrayed in the Y direction, is equal to 41.984 mm (41.984 mm=0.0410 mm×1,024). A distance L1 between a center position C1 of each row, along which the microlenses 55a, 55a, . . . are arrayed in the Y direction, and a column E1 located at one end (m=1) of each row is equal to 20.992 mm. Also, a distance L2 between the center position C1 of each row, along which the microlenses 55a, 55a, are arrayed in the Y direction, and a column E2 located at the other end (m=1,024) of each row is equal to 20.992 mm.

In cases where the exposure operation is to be performed for the photosensitive material 150 with the projecting exposure apparatus described above, for reasons of the photosensitive characteristics of the photosensitive material 150, it is necessary that the exposure operation be performed with an extinction ratio of 1:10 or with a better extinction ratio. The extinction ratio of 1:10 or the better extinction ratio is capable of being obtained in cases where the light beam having been reflected from each of the micromirrors 81, 81, . . . of the DMD 80 is caused to travel such that the light beam accurately passes through the corresponding one of the microlenses 55a, 55a, . . . of the microlens array 55. However, in cases where the light beam having been reflected from each of the micromirrors 81, 81, . . . of the DMD 80 does not accurately pass through the corresponding one of the microlenses 55a, 55a, of the microlens array 55, it becomes necessary to perform the adjustment of the magnification of image formation and the adjustment of the distortion.

Specifically, for example, as illustrated in FIG. 6, a light beam K1, which travels to a certain microlens 55a after being reflected from the corresponding micromirror 81, may travel to the microlens 55a such that the position of the light beam K1 is shifted by 4.1 μm in the Y direction. In such cases, since the width W1 of the microlens 55a, which width is taken along the Y direction, is equal to 41 μm, the light beam K1 having been reflected from the corresponding micromirror 81 passes through a region R1 of the corresponding microlens 55a, which region occupies 90% of the entire region of the microlens 55a (0.9=(41 μm–4.1 μm)/41 μm). However, the light beam K1 does not pass through a region R2 of the corresponding microlens 55a due to the shifting by 4.1 μm, and a light beam K2, which has been reflected from a micromirror 81 other than the micromirror 81 that has reflected the light beam K1, impinges upon the region R2 of the microlens 55a corresponding to the light beam K1. Therefore, in such cases, in accordance with the ratio of the area of the region R2 to the area of (region R1+region R2), the extinction ratio substantially becomes equal to 1:10. Accordingly, in order for an extinction ratio better than 1:10 to be obtained, it is necessary for the position of the optical path of the light beam K1 to be adjusted such that the shift of the light beam K1 traveling to the corresponding microlens 55a after being reflected from the corresponding micromirror 81, which shift is taken in the Y direction, may become smaller than 4.1 μm. More specifically, as described above, the distance L1 between the center position C1 of each row, along which the microlenses 55a, 55a, are arrayed in the Y direction, and the column E1 located at the one end (m=1) of each row is equal to 20.992 mm. Also, the distance L2 between the center position C1 of each row, along which the microlenses 55a, 55a, . . . are arrayed in the Y direction, and the column E2 located at the other end (m=1,024) of each row is equal to 20.992 mm. Therefore, with the magnification adjusting optical system 53, the position of the optical path of the light beam K1 may be adjusted with a magnification adjustment accuracy of approximately 0.2% (4.1 μm/20.992 mm≈0.0002).

Figure 7:
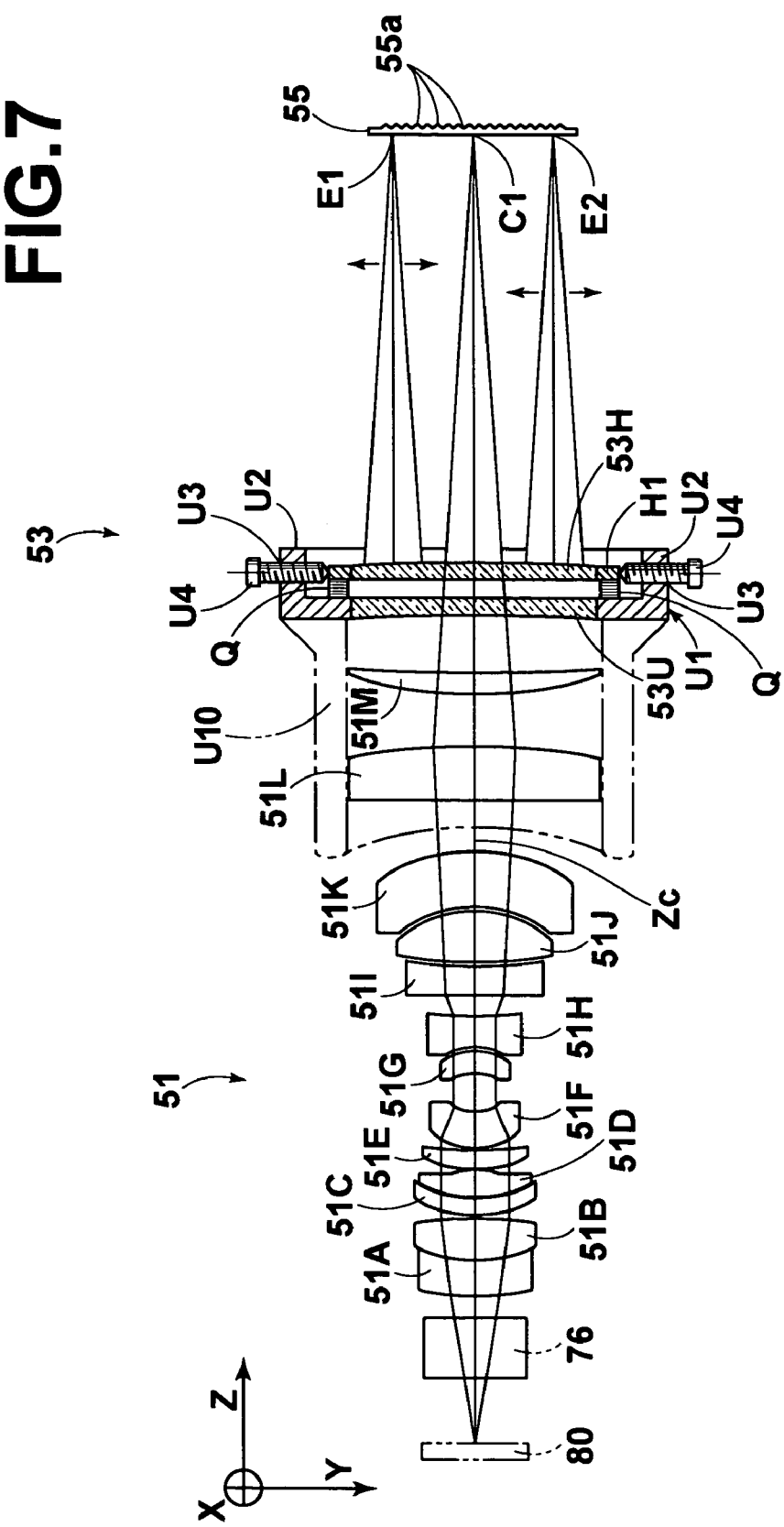
FIG. 7 is a side view showing the first image forming optical system and a magnification adjusting optical system.
Figures 8A, 8B:
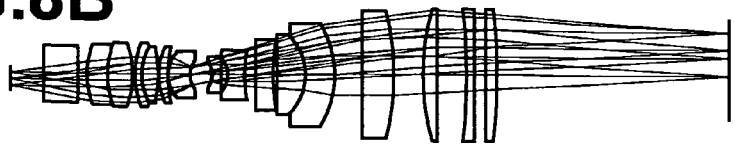
FIG. 8A is a table showing design values of the first image forming optical system and the magnification adjusting optical system.
FIG. 8B is a schematic view showing lens constitutions of the first image forming optical system and the magnification adjusting optical system and optical paths in the first image forming optical system and the magnification adjusting optical system.

The constitution of the magnification adjusting optical system 53 for obtaining the magnification adjustment accuracy of 0.2% and the constitution of the first image forming optical system 51 will hereinbelow be described in detail. FIG. 7 is a side view showing the first image forming optical system and a magnification adjusting optical system. FIG. 8A is a table showing design values of the first image forming optical system and the magnification adjusting optical system. FIG. 8B is a schematic view showing lens constitutions of the first image forming optical system and the magnification adjusting optical system and optical paths in the first image forming optical system and the magnification adjusting optical system. A prism 76 is located between the DMD 80 and the first image forming optical system 51. The prism 76 is a plane-parallel TIR prism (total reflection prism) composed of a combination of two triangular prisms. The prism 76 totally reflects the light, which has been reflected from a mirror 75, toward the DMD 80 and transmits the light, which has been reflected from the DMD 80.

As illustrated in FIG. 7 and FIG. 8A, the first image forming optical system 51 is provided with a lens 51A, a lens 51B, a lens 51C, a lens 51D, a lens 51E, a lens 51F, a lens 51G, a lens 51H, a lens 51I, a lens 51J, a lens 51KA, a lens 51L, and a lens 51M, which are located in this order as counted from the side of incidence of the light beams having been reflected from the DMD 80. The lenses 51A to 51M are accommodated within a lens frame U10 and are secured to the lens frame U10.

The light beams having been reflected from the certain micromirrors 81, 81, . . . , which are among the micromirrors 81, 81, . . . of the DMD 80 and are in the on state, and having passed through the prism 76 enter into the first image forming optical system 51. The light beams pass through the lenses 51A to 51M successively and thereafter pass through the magnification adjusting optical system 53. The light beams then impinge upon the microlens array 55.

The focal length of the concave lens 53U of the magnification adjusting optical system 53 is equal to −875 mm. The focal length of the convex lens 53H of the magnification adjusting optical system 53 is equal to 872 mm. Both the focal length of the concave lens 53U and the focal length of the convex lens 53H are longer than 800 mm. The convex lens 53H is secured by adhesion to a lens frame H1. The concave lens 53U is secured by adhesion to a lens frame U1, which is combined with the lens frame U10 of the first image forming optical system 51 into an integral body. The lens frame U1 is provided with a peripheral protruding section U2 for accommodating the lens frame H1 therein.

The peripheral protruding section U2 is provided with four threaded holes U3, U3, . . . , which are formed at intervals of 90 degrees around the optical axis Zc. The threaded holes U3, U3, . . . are located such that the threaded holes U3, U3, . . . extend in the directions normal to the optical axis Zc and heading toward the optical axis Zc. Four screws U4, U4, . . . are engaged respectively with the threaded holes U3, U3, . . . The position of the lens frame H1 accommodated within the lens frame U1 is adjusted by the screws U4, U4, . . . and with respect to the directions normal to the optical axis Zc and is fixed.

Also, a spacer Q composed of a plurality of spacers, each of which has a thickness of 100 $\mu$m, is located in the space between the lens frame U1 and the lens frame H1, which space is taken with respect to the direction of the optical axis Zc (i.e., the Z-direction) By the alteration of the thickness of the spacer Q, the position of the lens frame H1 with respect to the direction of the optical axis Zc (i.e., the Z direction) is adjusted.

Adjustment of Magnification of Image Formation

How the magnification of image formation at the time of the formation of the image of the two-dimensional pattern of the light is adjusted by the magnification adjusting optical system 53 will be described hereinbelow.

The adjustment of the magnification of image formation with the magnification adjusting optical system 53 is performed with an operation wherein the convex lens 53H is translated in parallel along the optical axis Zc of the first image forming optical system 51. For example, in cases where the convex lens 53H is moved by a distance of 100 $\mu$m toward the first image forming optical system 51 and along the optical axis Zc (i.e., the Z direction), each of the position of the light beam passing through the column E1, which is located at the one end of each row in the array of the microlenses 55a, 55a, . . . , and which is spaced by a distance of 20.992 mm away from the center position C1 of each row in the Y direction, and the position of the light beam passing through the column E2, which is located at the other end of each row in the array of the microlenses 55a, 55a, . . . , and which is spaced by a distance of 20.992 mm away from the center position C1 of each row in the Y direction, is capable of being moved by a distance of 4 $\mu$m toward the center position C1 described above along the Y direction.

Also, in cases where the convex lens 53H is moved by a distance of 100 $\mu$m toward the microlens array 55 and along the optical axis Zc (i.e., the Z direction), each of the position of the light beam passing through the column E1, which is located at the one end of each row in the array of the microlenses 55a, 55a, . . . , and the position of the light beam passing through the column E2, which is located at the other end of each row in the array of the microlenses 55a, 55a, . . . , is capable of being moved by a distance of 4 $\mu$m away from the center position C1 described above along the Y direction.

The movement of the convex lens 53H along the optical axis Zc (i.e., the Z direction) is capable of being performed with an operation wherein the number of the spacers constituting the spacer Q located between the lens frame H1 of the convex lens 53H and the lens frame U1 of the concave lens 53U, each of which spacers has a thickness of 100 $\mu$m, is altered. In this manner, the magnification of image formation at the time of the formation of the image of the two-dimensional pattern of the light with the first image forming optical system 51 is capable of being adjusted with the magnification adjustment accuracy of approximately 0.2%.

Correction of Distortion

How the distortion is corrected by the magnification adjusting optical system 53 acting also as the distortion correcting optical system will be described hereinbelow.

The correction of the distortion with the magnification adjusting optical system 53 is performed with an operation wherein the convex lens 53H is translated in parallel along the direction, which is normal to the optical axis Zc of the first image forming optical system 51. For example, in cases where the convex lens 53H is moved by a distance of 430 $\mu$m toward the column E1, which is located at the one end of each row in the array of the microlenses 55a, 55a, . . . , and along the Y direction, the pitches of the light beams impinging upon the microlenses 55a, 55a, . . . , which are located in the region ranging from the center position C1 of each row in the Y direction to the column E1 at the one end of each row, are capable of being narrowed by approximately 0.02%. Also, at the same time, the pitches of the light beams impinging upon the microlenses 55a, 55a, . . . , which are located in the region ranging from the center position C1 of each row in the Y direction to the column E2 at the other end of each row, are capable of being widened by approximately 0.02%.

The movement of the convex lens 53H along the direction, which is normal to the optical axis Zc (i.e., the Z direction), is capable of being performed with an operation wherein the lens frame H1 accommodated within the lens frame U1 is moved by the four screws U4, U4, . . .

In the embodiment described above, the magnification adjusting optical system 53 is constituted of the combination of the concave lens 53U and the convex lens 53H, and each of the focal length of the concave lens 53U and the focal length of the convex lens 53H is equal to at least 800 mm. Also, the value of the ratio of the focal length of the convex lens 53H to the focal length of the concave lens 53U is equal to approximately 1. However, in the projecting exposure apparatus in accordance with the present invention, the magnification adjusting optical system is not limited to the magnification adjusting optical system 53 having the constitution described above. For example, in cases where the value of the ratio of the focal length of the convex lens 53H to the focal length of the concave lens 53U is not equal to approximately 1, in cases where each of the focal length of the concave lens 53U and the focal length of the convex lens 53H is not at least 800 mm, or in cases where the magnification adjusting optical system has a constitution other than the constitution constituted of the combination of the concave lens 53U and the convex lens 53H, the same effects as those described above are capable of being obtained with the provision of the magnification adjusting optical system, which is capable of adjusting the magnification of image formation at the time of the formation of the image of the two-dimensional pattern of the light with the image forming optical system, between the image forming optical system and the microlens array.

The embodiment of the projecting exposure apparatus in accordance with the present invention, which comprises the exposure head 166 provided with the optical system 50 having the image-side telecentric image forming optical system, will hereinbelow be described in detail.

Explanation of Entire Constitution of the Projecting Exposure Apparatus

Figure 9:
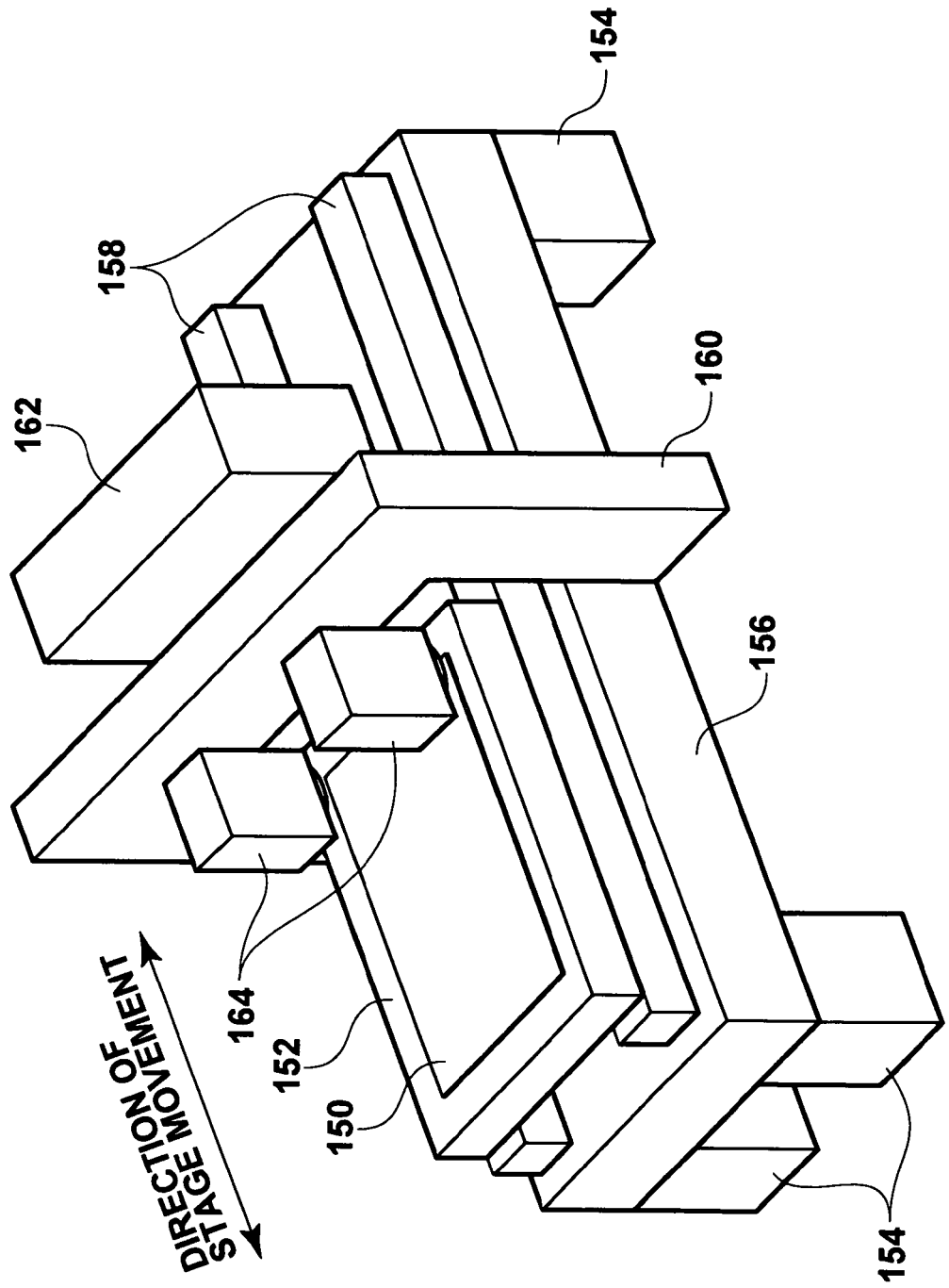
FIG. 9 is a perspective view showing an appearance of the embodiment of the projecting exposure apparatus in accordance with the present invention.
Figure 11A:
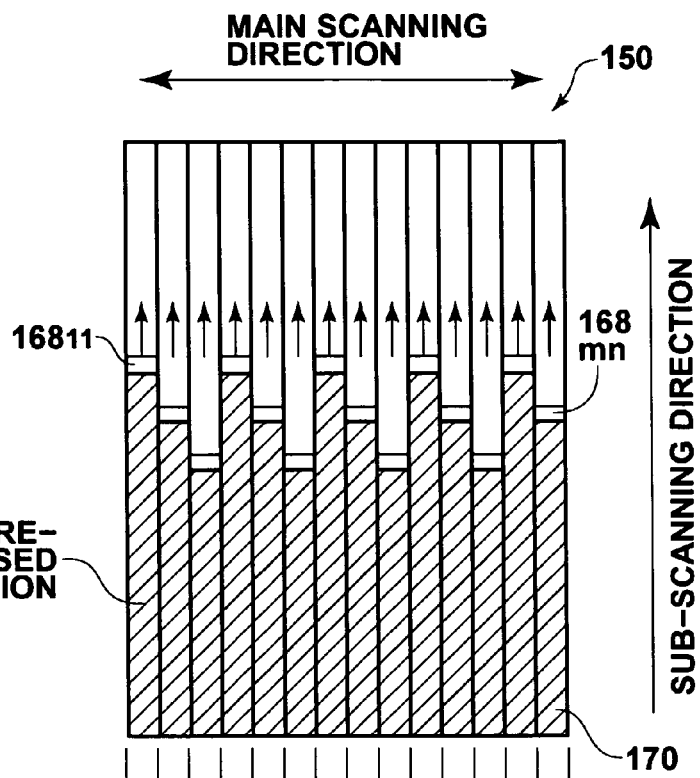
FIG. 11A is a plan view showing exposure-processed regions, which are formed on a photosensitive material.
Figure 11B:
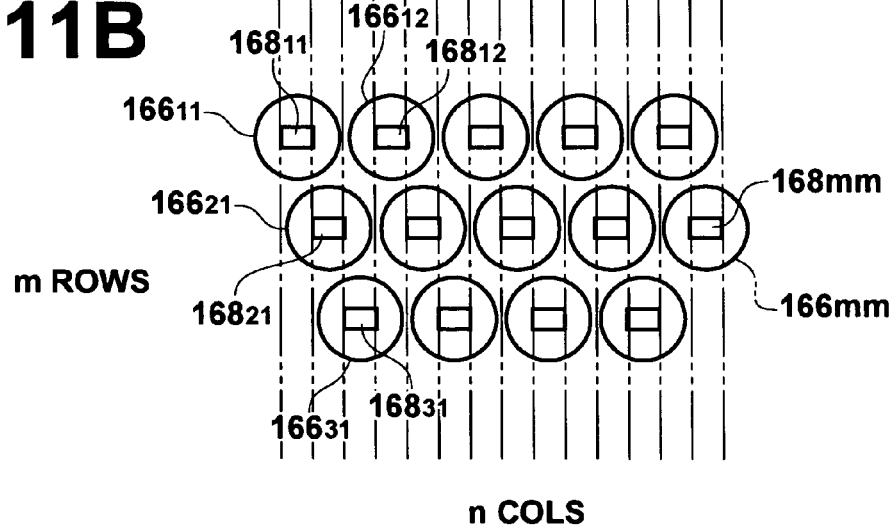
FIG. 11B is an explanatory view showing an array of exposure processing areas, each of which is subjected to exposure processing performed by one of exposure heads.

FIG. 9 is a perspective view showing an appearance of the embodiment of the projecting exposure apparatus in accordance with the present invention. FIG. 10 is a perspective view showing how an exposure operation is performed by the projecting exposure apparatus of FIG. 9. FIG. 11A is a plan view showing exposure-processed regions, which are formed on a photosensitive material. FIG. 11B is an explanatory view showing an array of exposure processing areas, each of which is subjected to exposure processing performed by one of exposure heads.

As illustrated in FIG. 9, the embodiment of the projecting exposure apparatus in accordance with the present invention comprises a scanner unit 162 and a main body section for supporting the scanner unit 162. The main body section is provided with a flat plate-like stage 152 for supporting the photosensitive material 150 on the surface by suction. The main body section is also provided with a support base 156 and two guides 158, 158 secured to the surface of the support base 156. The guides 158, 158 extend in a sub-scanning direction and support the stage 152 such that the stage 152 is capable of moving in the sub-scanning direction. The stage 152 is supported by the guides 158, 158 such that the stage 152 is capable of reciprocally moving in the sub-scanning direction. The stage 152 is located such that the longitudinal direction of the stage 152 coincides with the sub-scanning direction. The projecting exposure apparatus is provided with an actuating section (not shown) for moving the stage 152 along the guides 158, 158.

A scanner support section 160 having a portal shape is located at a middle part of the support base 156. The scanner support section 160 extends over the movement path of the stage 152 and supports the scanner unit 162. The scanner support section 160 supports the scanner unit 162 on one side of the scanner support section 160, which side is taken with respect to the sub-scanning direction. The scanner support section 160 is provided with two detection sensors 164, 164 on the other side of the scanner support section 160, which side is taken with respect to the sub-scanning direction. The detection sensors 164, 164 detect a leading end and a tail end of the photosensitive material 150. The scanner unit 162 and the detection sensors 164, 164 are thus secured to the opposite sides of the scanner support section 160 and are located above the movement path of the stage 152. The scanner unit 162 and the detection sensors 164, 164 are connected to a controller (not shown) for controlling the scanner unit 162 and the detection sensors 164, 164. In FIG. 9, the reference numerals 154, 154, . . . represent pillars.

As illustrated in FIG. 10 and FIGS. 11A, 11B, the scanner unit 162 is provided with a plurality of (e.g., 14) exposure heads 166, 166, . . . for irradiating the exposure light to the photosensitive material 150. The exposure heads 166, 166, . . . are arrayed approximately in a matrix-like pattern composed of "m" number of rows and "n" number of columns (e.g., three rows and five columns).

In this embodiment, in accordance with the width of the photosensitive material 150, five exposure heads 166, 166, . . . are located along each of the first and second rows, and four exposure heads 166, 166, . . . are located along the third row. In cases where a certain exposure head 166 in the array of the exposure heads 166, 166, . . . , which exposure head is located at a position of an m'th row and an n'th column in the array of the exposure heads 166, 166, . . . , is to be represented, the certain exposure head 166 is herein represented as an exposure head $166_{mn}$.

As illustrated in FIG. 11B, an exposure processing area $168_{mn}$ corresponding to each exposure head $166_{mn}$, which exposure processing area is subjected to the exposure processing performed by the exposure head $166_{mn}$, has an approximately rectangular shape, whose short side extends along the sub-scanning direction. As illustrated in FIG. 11A, as the stage 152 moves along the sub-scanning direction, a band-shaped exposure-processed region $170_{mn}$ corresponding to each exposure head $166_{mn}$ is formed on the photosensitive material 150.

As illustrated in FIG. 11B, in the array of the exposure heads 166, 166, . . . of the scanner unit 162, a row of the exposure heads 166, 166, . . . and an adjacent row of the exposure heads 166, 166, . . . are shifted by a predetermined distance from each other with respect to a main scanning direction, which is normal to the sub-scanning direction described above. Such that the band-shaped exposure-processed regions 170, 170, . . . may be formed on the photosensitive material 150 without any unprocessed space being left between the band-shaped exposure-processed regions 170, 170, in the main scanning direction, the areas, which are located between, for example, an exposure processing area $168_{11}$ and an exposure processing area $168_{12}$ corresponding respectively to an exposure head $166_{11}$ and an exposure head $166_{12}$ located along the first row, and which are not capable of being subjected to the exposure processing performed by the exposure head $166_{11}$ and the exposure head $166_{12}$, are exposure-processed with an exposure head $166_{21}$, which is located along the second row and corresponds to an exposure processing area $168_{21}$, and an exposure head $166_{31}$, which is located along the third row and corresponds to an exposure processing area $168_{31}$.

Each of the exposure heads 166, 166, . . . is constituted of the light source unit 60 described above, the DMD 80 described above, the optical system 50 described above, and a DMD irradiation optical system 70, which receives the light for exposure from the light source unit 60 and irradiates the light to the DMD 80. The light having been obtained from the spatial light modulation performed by the DMD 80 is guided onto the photosensitive material 150, and the photosensitive material 150 is thus exposed to the light.

Explanation of Elements Constituting the Exposure Head 166

The elements constituting each of the exposure heads 166, 166, . . . will be described hereinbelow. The optical system 50 has the constitution described above.

Light Source Unit 60

The light source unit 60 comprises a plurality of (e.g., six) laser beam combining light sources 40, 40, . . . The light source unit 60 also comprises a laser beam radiating section 61. The laser beam radiating section 61 units a plurality of optical fibers 31, 31, . . . , each of which is connected to one of multimode optical fibers 30, 30, . . . Each of the multimode optical fibers 30, 30, . . . acts as a constituent element of one of the laser beam combining light source s 40, 40, . . .

Explanation of the Laser Beam Combining Light Source 40

Figure 12:
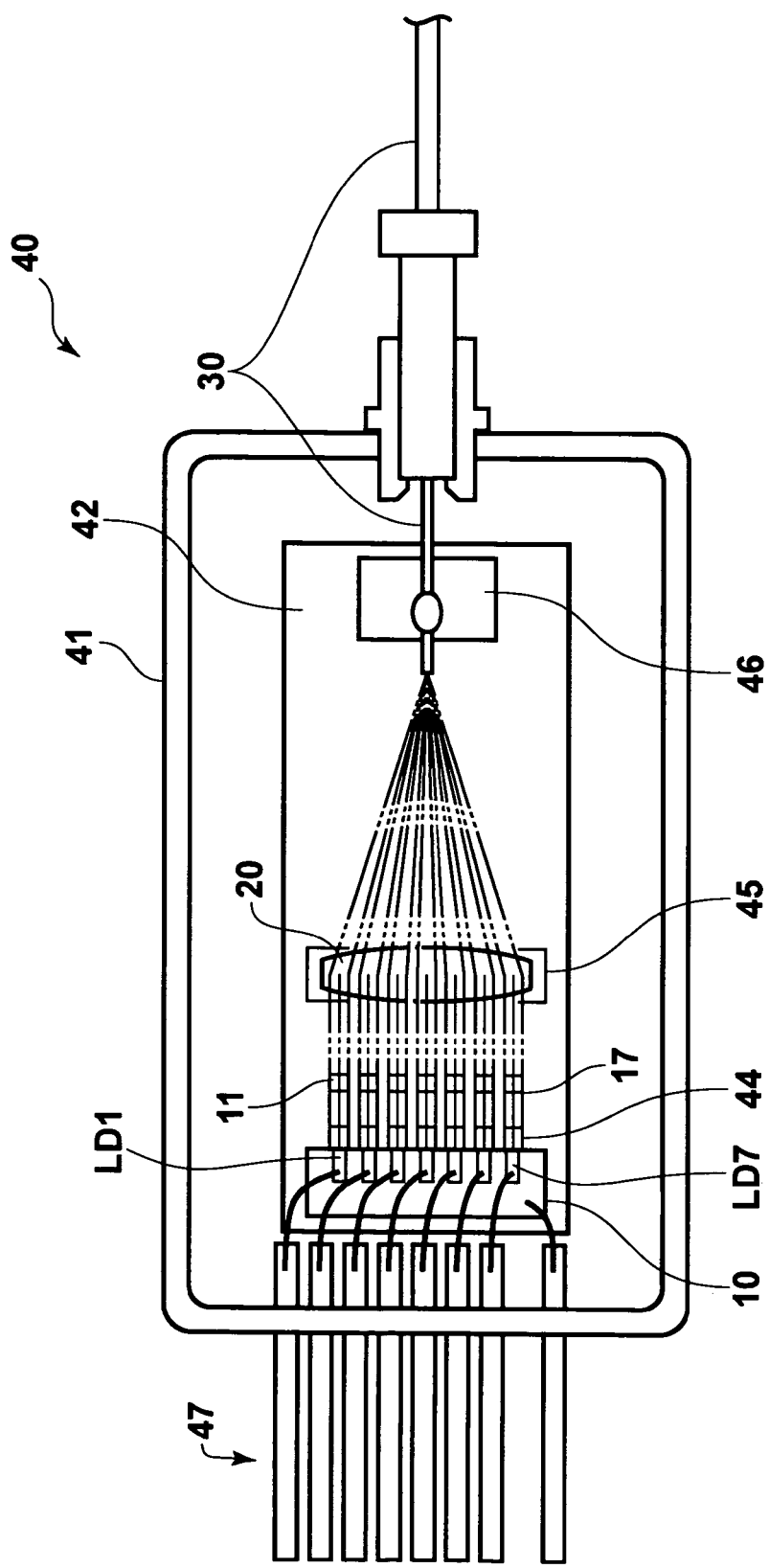
FIG. 12 is a plan view showing a laser beam combining light source.
Figure 13:
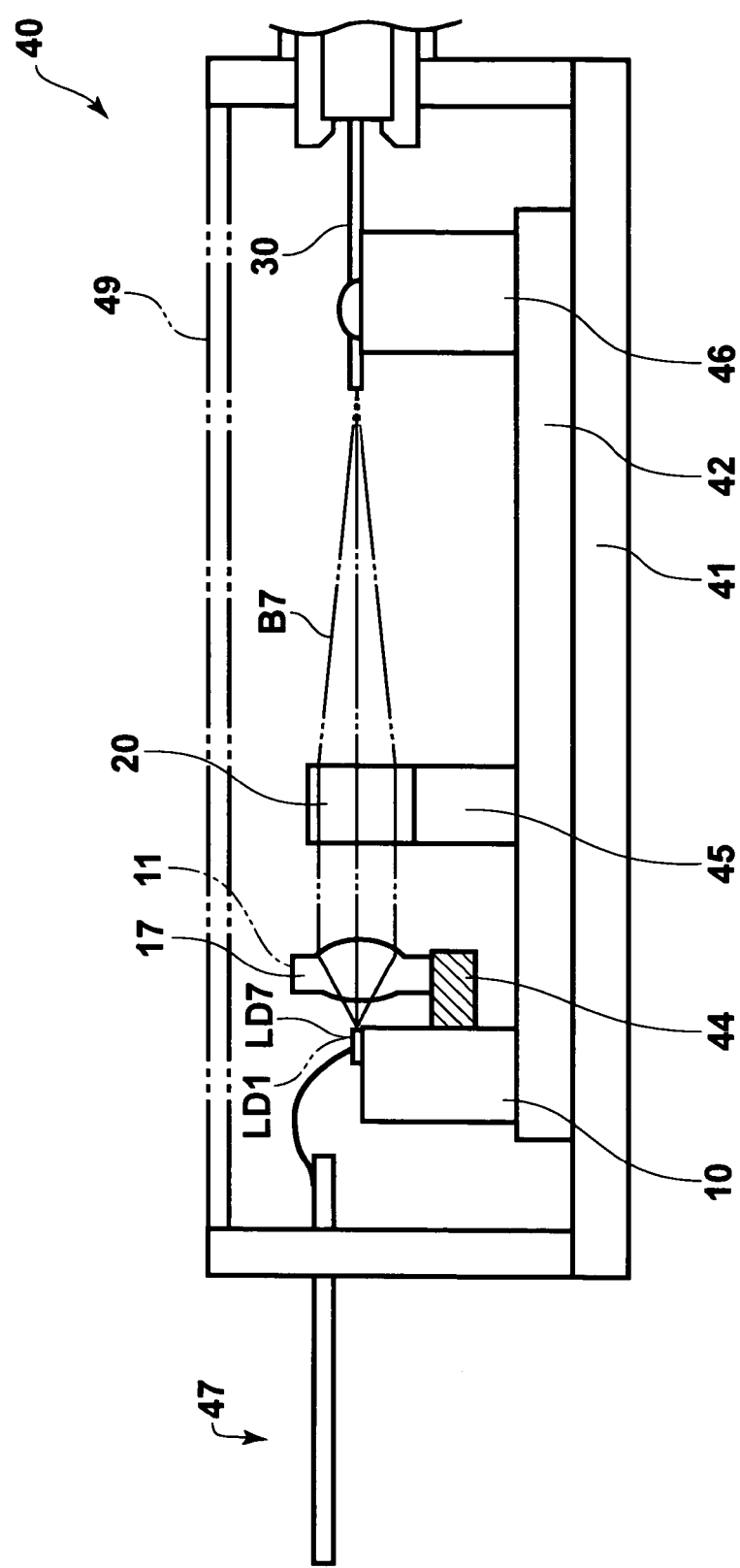
FIG. 13 is a side view showing the laser beam combining light source.
Figure 14:
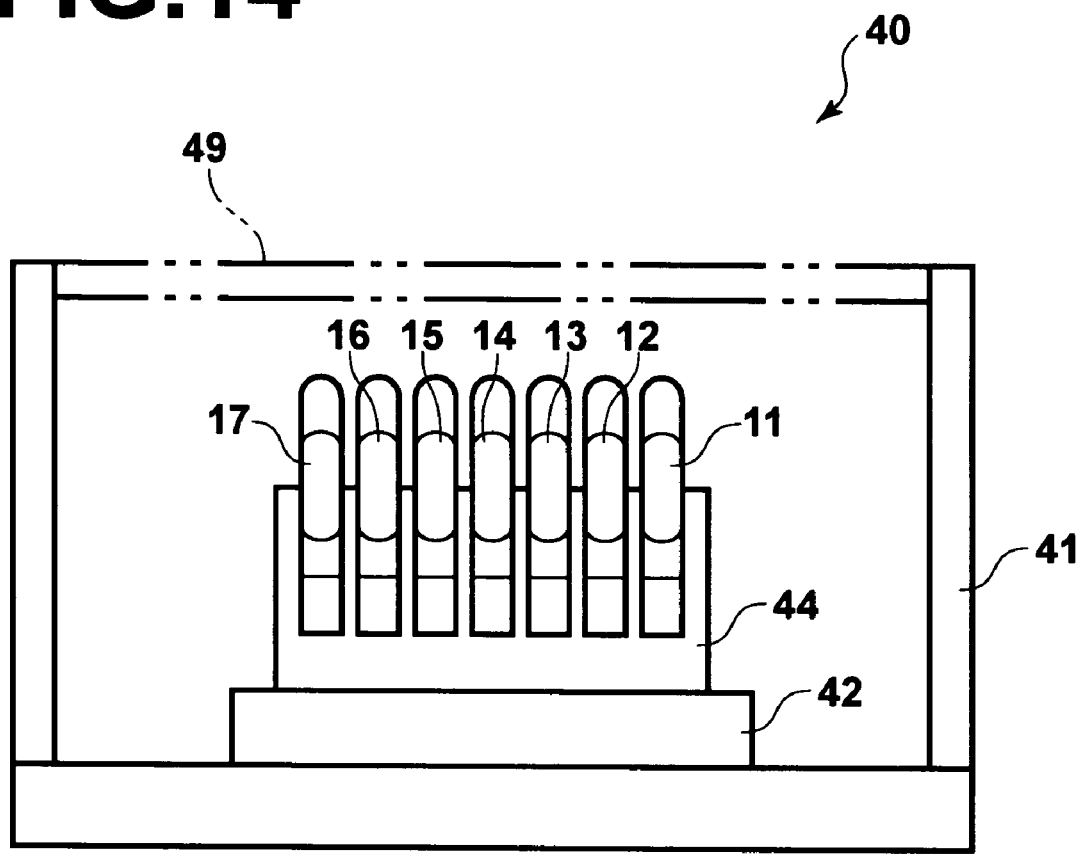
FIG. 14 is a front view showing the laser beam combining light source.

FIG. 12 is a plan view showing a laser beam combining light source. FIG. 13 is a side view showing the laser beam combining light source. FIG. 14 is a front view showing the laser beam combining light source. FIG. 15 is an enlarged plan view showing optical elements of the laser beam combining light source.

Constitution of the Laser Beam Combining Light Source 40

Each of the laser beam combining light sources 40, 40, . . . comprises a plurality of semiconductor lasers LD1, LD2, LD3, LD4, LD5, LD6, and LD7. The laser beam combining light source 40 also comprises the one multimode optical fiber 30. The laser beam combining light source 40 further comprises a combination of collimator lenses 11 to 17 and one converging lens 20. The combination of the collimator lenses 11 to 17 and the converging lens 20 acts as laser beam converging means for converging an entire laser beam, which is composed of laser beams having been produced by the plurality of the semiconductor lasers LD1 to LD7, and irradiating the entire laser beam onto a core region of the multimode optical fiber 30. The laser beams constituting the entire laser beam are combined with one another in the multimode optical fiber 30. The combined laser beam passes through the multimode optical fiber 30 and is radiated out from the multimode optical fiber 30.

More specifically, the laser beam combining light source 40 comprises the plurality of (e.g., seven) chip-like GaN type semiconductor lasers LD1, LD2, LD3, LD4, LD5, LD6, and LD7, which may be of a transverse multimode or a single mode. The GaN type semiconductor lasers LD1, LD2, LD3, LD4, LD5, LD6, and LD7 are arrayed in one direction and secured to a top surface of a heat block 10, which is made from a material having a high heat transfer coefficient, such as copper. The laser beam combining light source 40 also comprises the collimator lenses 11, 12, 13, 14, 15, 16, and 17, which correspond respectively to the GaN type semiconductor lasers LD1, LD2, LD3, LD4, LD5, LD6, and LD7. The laser beam combining light source 40 further comprises the converging lens 20 for converging the entire laser beam, which is composed of the laser beams having been radiated out from the collimator lenses 11 to 17, into one spot. The laser beam combining light source 40 still further comprises the one multimode optical fiber 30 for receiving the entire laser beam, which has been converted by the converging lens 20, and combining the laser beams constituting the entire laser beam with one another.

The number of the semiconductor lasers LD1, LD2, . . . is not limited to seven. For example, laser beams having been produced by 20 semiconductor lasers may be irradiated to a multimode optical fiber, which has a cladding layer diameter of 60 $\mu$m, a core diameter of 50 $\mu$m, and NA of 0.2.

The laser beams produced by the GaN type semiconductor lasers LD1 to LD7 may have an identical wavelength (of, e.g., 405 nm). Also, the GaN type semiconductor lasers LD1 to LD7 may have an identical maximum output power (e.g., 100 mW in the cases of multimode lasers, or 30 mW in the cases of single mode lasers). Alternatively, as the GaN type semiconductor lasers LD1 to LD7, lasers capable of producing laser beams, which have a wavelength other than 405 nm and falling within the range of 350 nm to 450 nm, may be employed.

As illustrated in FIG. 12, FIG. 13, and FIG. 14, the optical elements of the laser beam combining-light source 40 are accommodated within a box-like package 41, which has an opening at the top region. The package 41 is provided with a package cover 49 capable of closing the opening of the package 41. After the box-like package 41 is subjected to deaeration processing, a sealing gas is introduced into the package 41, and the opening of the package 41 is closed by the package cover 49. In this manner, the closed space (sealed space), which is surrounded by the package 41 and the package cover 49, is hermetically sealed.

A base plate 42 is secured to an inside bottom surface of the package 41. The heat block 10 described above, a converging lens holder 45 for supporting the converging lens 20, and a fiber holder 46 for supporting an entry end section of the multimode optical fiber 30 are secured to a top surface of the base plate 42. A radiating end section of the multimode optical fiber 30 is drawn out through an aperture, which is formed through a side wall of the package 41, to the exterior of the package 41.

The temperature of the base plate 42 is adjusted by temperature adjusting means, which utilizes a fluid as a medium, a Peltier device, (not shown), or the like. While the projecting exposure apparatus is being operated, the temperature of the base plate 42 is kept at a predetermined value.

A collimator lens holder 44 is secured to a side surface of the heat block 10. The collimator lenses 11 to 17 are supported by the collimator lens holder 44. Also, electric wires 47, 47, . . . for supplying actuating electric currents to the GaN type semiconductor lasers LD1 to LD7 are drawn out through an aperture, which is formed through a side wall of the package 41.

In FIG. 12 and FIG. 13, as an aid in facilitating the explanation, only the GaN type semiconductor lasers LD1 and LD7 among the plurality of the GaN type semiconductor lasers LD1 to LD7 are numbered. Also, only the collimator lenses 11 and 17 among the plurality of the collimator lenses 11 to 17 are numbered.

FIG. 14 is a front view showing the part at which the collimator lenses 11 to 17 are fitted. Each of the collimator lenses 11 to 17 is an aspherical lens and is formed in a slender shape such that a region containing the optical axis of the aspherical lens has been cut along planes parallel to the optical axis. Each of the collimator lenses 11 to 17 having the slender shape may be formed with, for example, a resin shaping process or a glass shaping process. The collimator lenses 11 to 17 are located at positions which are close to one another and which stand side by side along the array direction of light emission points of the GaN type semiconductor lasers LD1 to LD7 (i.e., the horizontal direction in FIG. 14), such that the longitudinal direction of each of the collimator lenses 11 to 17 may be normal to the array direction of the light emission points of the GaN type semiconductor lasers LD1 to LD7 (i.e., the horizontal direction in FIG. 14).

Each of the GaN type semiconductor lasers LD1 to LD7 may be provided with an active layer having a light emission width of 2 $\mu$m. The GaN type semiconductor lasers LD1 to LD7 may produce laser beams B1 to B7, respectively, in a state such that a spread angle with respect to the direction parallel to the surface of the active layer is, for example, 10°, and such that the spread angle with respect to the direction normal to the surface of the active layer is, for example, 30°.

Each of the GaN type semiconductor lasers LD1 to LD7 is located in an orientation such that the surface of the active layer may be parallel to the array direction of the light emission points of the GaN type semiconductor lasers LD1 to LD7. Specifically, the direction, which is associated with the large spread angle of each of the laser beams B1 to B7 radiated out respectively from the light emission points described above, coincides with the longitudinal direction of each of the collimator lenses 11 to 17 having the slender shape. Also, the direction, which is associated with the small spread angle of each of the laser beams B1 to B7 radiated out respectively from the light emission points described above, coincides with the lateral direction of each of the collimator lenses 11 to 17.

The length of each of the collimator lenses 11 to 17, which length is taken along the longitudinal direction of each of the collimator lenses 11 to 17, may be equal to 4.6 mm. The width of each of the collimator lenses 11 to 17, which width is taken along the lateral direction of each of the collimator lenses 11 to 17, may be equal to 1.1 mm. Also, the length of a major axis of the elliptic beam shape of each of the laser beams B1 to B7 incident upon the collimator lenses 11 to 17, respectively, may be equal to 2.6 mm. The length of a minor axis of the elliptic beam shape of each of the laser beams B1 to B7 incident upon the collimator lenses 11 to 17, respectively, may be equal to 0.9 mm. Each of the collimator lenses 11 to 17 may be constituted such that a focal length f is equal to 3 mm, NA is equal to 0.6, and a lens array pitch is equal to 1.25 mm.

The converging lens 20 is formed in a slender shape such that a region containing the optical axis of an aspherical lens has been cut along planes parallel to the optical axis. The converging lens 20 is located in an orientation such that the longitudinal direction of the converging lens 20 coincides with the array direction of the collimator lenses 11 to 17, and such that the lateral direction of the converging lens 20 coincides with the direction normal to the array direction of the collimator lenses 11 to 17.

The converging lens 20 is constituted such that a focal length f is equal to 23 mm, and NA is equal to 0.2. The converging lens 20 may be formed with, for example, a resin shaping process or a glass shaping process.

Operation of the Laser Beam Combining Light Source 40

Each of the laser beams B1, B2, B3, B4, B5, B6, and B7, which have been radiated out respectively from the GaN type semiconductor lasers LD1, LD2, LD3, LD4, LD5, LD6, and LD7 constituting the laser beam combining light source 40 described above, is collimated by the corresponding one of the collimator lenses 11 to 17. The laser beams B1 to B7 having thus been collimated are converged by the converging lens 20 and impinge upon the entry end face of a core section 30a of the multimode optical fiber 30.

The laser beams B1 to B7 having thus been collimated by the converging lens 20 enter into the core section 30a of the multimode optical fiber 30 and are combined into a combined laser beam B. The combined laser beam B travels through the multimode optical fiber 30 and is radiated out from a radiating end face of the multimode optical fiber 30. The combined laser beam B having thus been radiated out from the radiating end face of the multimode optical fiber 30 impinges upon an optical fiber 31 connected to the multimode optical fiber 30 as will be described later.

For example, in cases where a coupling efficiency of the laser beams B1 to B7 with the multimode optical fiber 30 is equal to 0.85, and the output power of each of the GaN type semiconductor lasers LD1 to LD7 is equal to 30 mW, the combined laser beam B is capable of being obtained with an output power of 180 mW (=30 mW×0.85×7). The combined laser beam B obtained with the output power described above travels through the multimode optical fiber 30 to the optical fiber 31. Therefore, the output power obtained at the laser beam radiating section 61 described below, at which the six optical fibers 31, 31, ... connected respectively to the multimode optical fibers 30, 30, ... of the laser beam combining light sources 40, 40, ... are united together, becomes equal to approximately 1 W (=180 mW×6).

Laser Beam Radiating Section 61

Figure 16A:
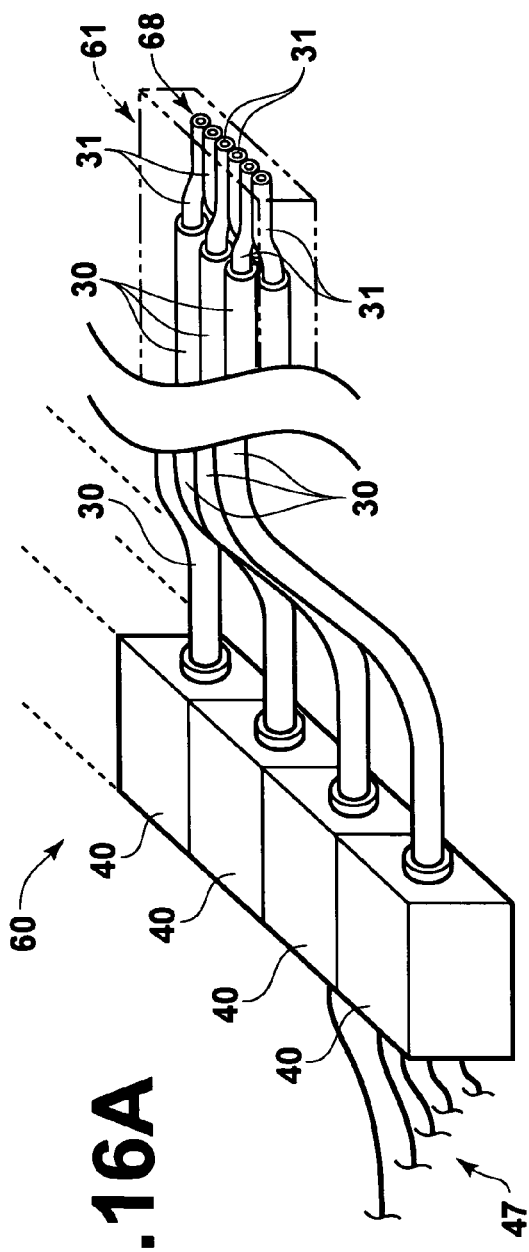
FIG. 16A is a perspective view showing a light source unit.
Figure 16B:
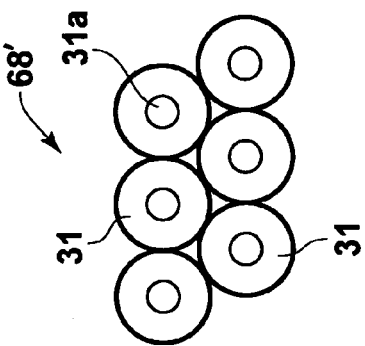
FIG. 16B is an enlarged view showing a part of a laser beam radiating section.
Figure 16C:
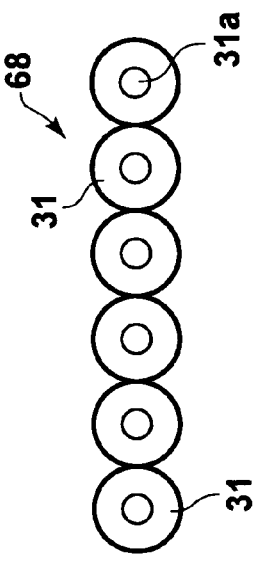
FIG. 16C is a front view showing an example of an array of optical fibers at the laser beam radiating section.
Figure 16D:
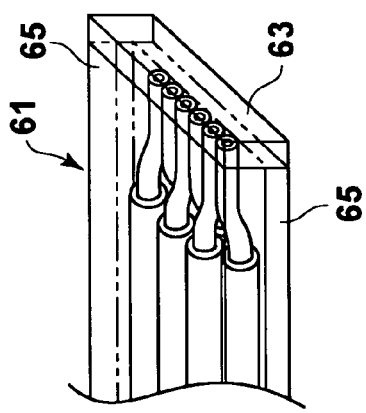
FIG. 16D is a front view showing a different example of an array of optical fibers at the laser beam radiating section.
Figure 17:
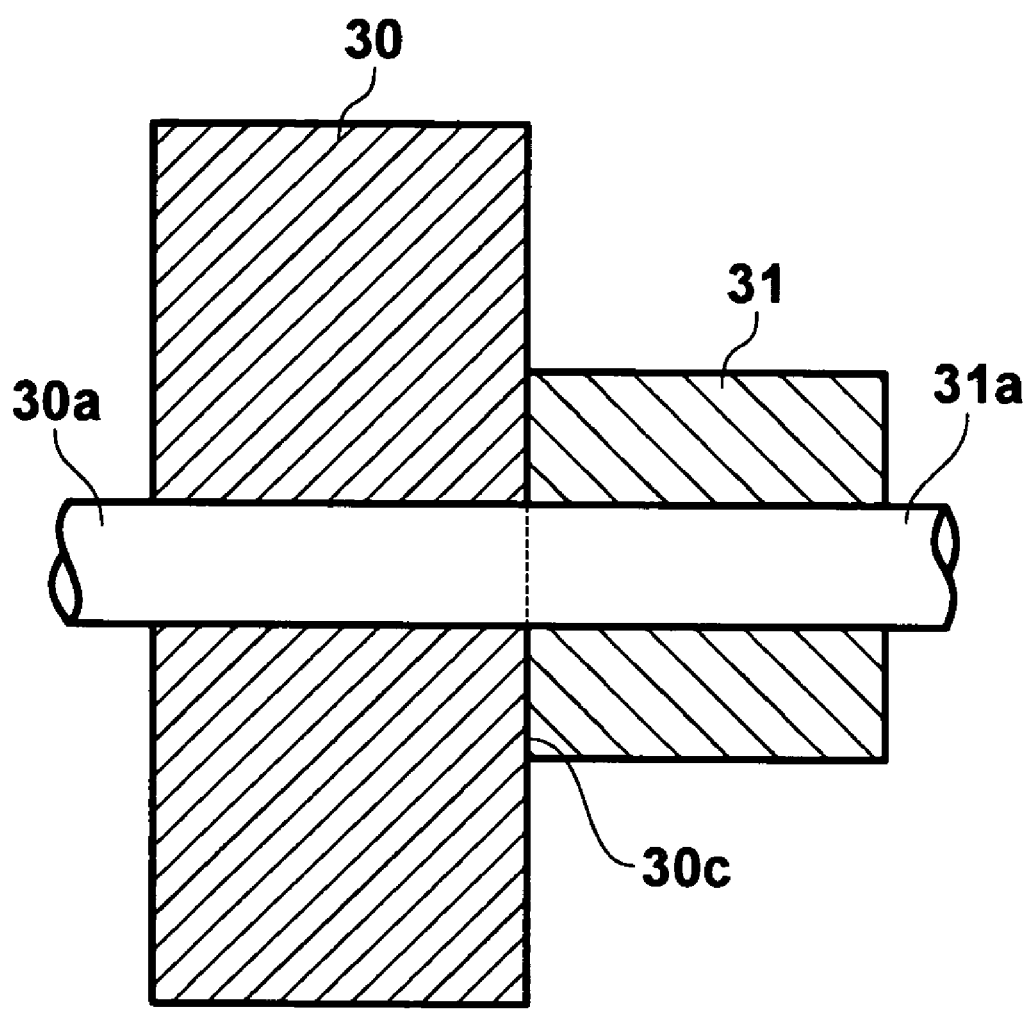
FIG. 17 is a view showing how a multimode optical fiber of the laser beam combining light source and the optical fiber at the laser beam radiating section are connected to each other.

The laser beam radiating section 61 will be described hereinbelow with reference to FIGS. 16A, 16B and FIG. 17. FIG. 16A is a perspective view showing how multimode optical fibers of the laser beam combining light sources are connected to optical fibers of a laser beam radiating section in a light source unit. FIG. 16B is an enlarged view showing a part of the laser beam radiating section. FIG. 16C is a front view showing an example of an array of the optical fibers at the laser beam radiating section. FIG. 16D is a front view showing a different example of an array of the optical fibers at the laser beam radiating section. FIG. 17 is a view showing how the multimode optical fiber of the laser beam combining light source-and the optical fiber at the laser beam radiating section are connected to each other.

As illustrated in FIGS. 16A and 16B, the laser beam radiating section 61 described above comprises the optical fibers 31, 31, ..., support plates 65, 65, and a protective plate 63. The laser beam radiating section 61 is constituted in the manner described below.

As illustrated in FIG. 16A, the radiating end of each of the multimode optical fibers 30, 30, ... of the laser beam combining light sources 40, 40, ... is connected to the entry end of the corresponding one of the optical fibers 31, 31, ... of the laser beam radiating section 61. The entry end of each of the optical fibers 31, 31, ... has a core diameter, which is identical with the core diameter of the multimode optical fiber 30, and a cladding layer diameter, which is smaller than the cladding layer diameter of the multimode optical fiber 30. Also, as illustrated in FIG. 16C, the radiating ends of the optical fibers 31, 31, ... are arrayed in a row and thus constitute a radiating end section 68. Alternatively, as illustrated in FIG. 16D, the radiating ends of the optical fibers 31, 31, ... may be stacked and arrayed in two rows and may thus constitute a radiating end section 68'.

As illustrated in FIG. 16B, the portions of the optical fibers 31, 31, ... located on the radiating side are sandwiched between the two support plates 65, 65 having flat surfaces and are thus secured in predetermined positions. Also, the protective plate 63, which is transparent and is made from glass, or the like, for protecting the end faces of the optical fibers 31, 31, ... on the radiating side, is located at the end faces of the optical fibers 31, 31, ... on the radiating side. The protective plate 63 may be located such that it is in close contact with the radiating end faces of the optical fibers 31, 31, ... Alternatively, the protective plate 63 may be located such that it is not in close contact with the radiating end faces of the optical fibers 31, 31, ...

The connection of the optical fiber 31 and the multimode optical fiber 30 to each other may be made in the manner illustrated in FIG. 17. Specifically, the end face of the optical fiber 31 having the small cladding layer diameter is connected co-axially to a small-diameter region 30c of the end face of the multimode optical fiber 30 having the large cladding layer diameter. The connection may be performed with, for example, a fusion bonding process.

Alternatively, the connection of the optical fiber 31 and the multimode optical fiber 30 to each other may be made in the manner described below. Specifically, a short optical fiber may be prepared with a process, wherein an optical fiber having a short length and a small cladding layer diameter is fusion-bonded to an optical fiber having a short length and a large cladding layer diameter. The short optical fiber may then be connected to the radiating end of the multimode optical fiber 30 via a ferrule, an optical connector, or the like. In cases where the optical fiber 31 and the multimode optical fiber 30 are releasably connected to each other by the utilization of the connector, or the like, the optical fiber having the small cladding layer diameter is capable of being exchanged easily at the time of the breakage, or the like, and the cost required for the maintenance operations for the exposure head is capable of being kept low.

Each of the multimode optical fiber 30 and the optical fiber 31 may be a step index type optical fiber, a graded index type optical fiber, or a composite type optical fiber. For example, a step index type optical fiber, which is supplied by Mitsubishi Densen Kogyo, K.K., maybe utilized as each of the multimode optical fiber 30 and the optical fiber 31. In this embodiment, each of the multimode optical fiber 30 and the optical fiber 31 is constituted of the step index type optical fiber.

The multimode optical fiber 30 is constituted such that the cladding layer diameter is equal to 125 $\mu$m, the core diameter is equal to 50 $\mu$m, MA is equal to 0.2, and the transmittance of the entry end face coating layer is equal to at least 99.5%. The optical fiber 31 is constituted such that the cladding layer diameter is equal to 60 $\mu$m, the core diameter is equal to 50 $\mu$m, and NA is equal to 0.2.

DMD 80

Figure 18A:
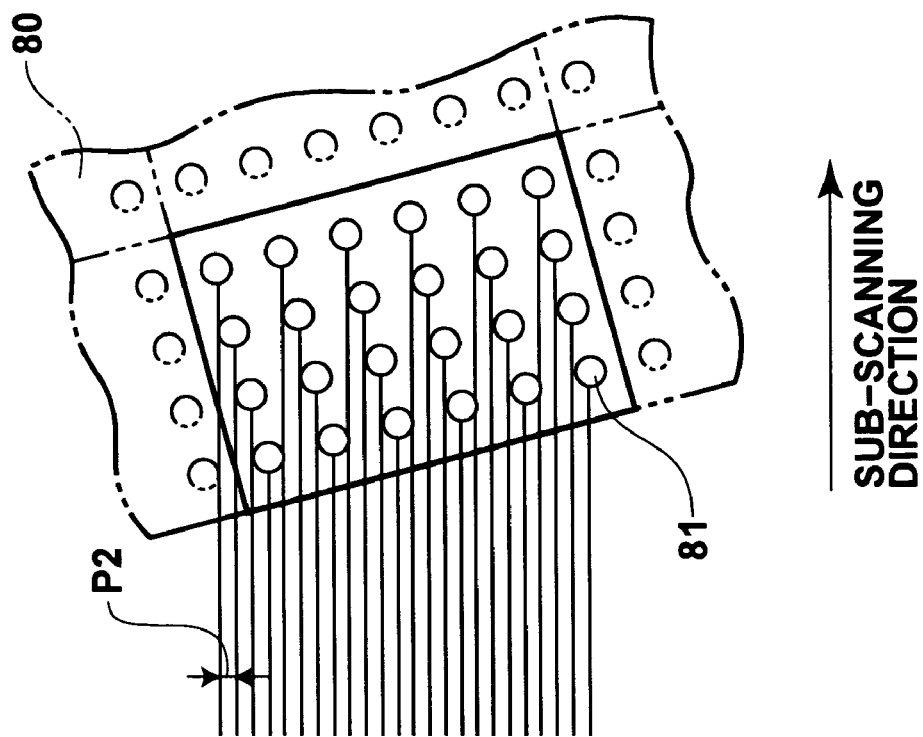
FIG. 18A is a plan view showing how the photosensitive material is exposed to light beams in cases where the DMD is located in an orientation, which is not oblique.
Figure 18B:
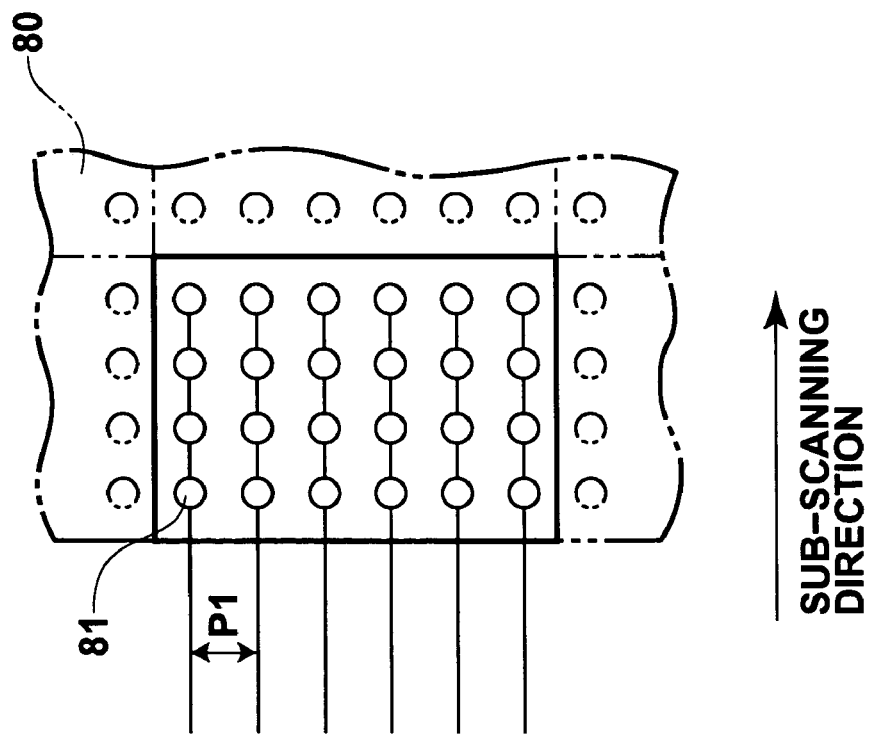
FIG. 18B is a plan view showing how the photosensitive material is exposed to the light beams in cases where the DMD is located in an oblique orientation.

The DMD 80 will be described hereinbelow. FIG. 18A is a plan view showing how the photosensitive material is exposed to light beams in cases where the DMD is located in an orientation, which is not oblique. FIG. 18B is a plan view showing how the photosensitive material is exposed to the light beams in cases where the DMD is located in an oblique orientation.

As described above with reference to FIG. 1 and FIG. 2, each of the exposure heads 166, 166, . . . is provided with the digital micromirror device (DMD) 80 (shown in FIG. 3) acting as the spatial light modulation means for modulating the incident laser beam in accordance with a predetermined control signal. The DMD 80 is connected to a controller (not shown), which is provided with a signal processing section and a mirror actuation control section. In accordance with a received image signal, the signal processing section of the controller forms the control signal for controlling the actuation of each of the micromirrors 81, 81, . . . of the DMD 80. The control signal is formed for each of the exposure heads 166, 166, . . . Also, in accordance with the control signal having been formed by the signal processing section, the mirror actuation control section of the controller controls the angle of the reflection surface of each of the micromirrors 81, 81, . . . of the DMD 80 of each of the exposure heads 166, 166, . . .

The DMD 80 comprises an array of the micromirrors 81, 81, . . . , which array is composed of a plurality of (e.g., 1,024) columns of the micromirrors 81, 81, . . . standing side by side with respect to the longitudinal direction of the DMD 80 and a plurality of (e.g., 756) rows of the micromirrors 81, 81, . . . standing side by side with respect to the lateral direction of the DMD 80. As illustrated in FIG. 18B, in cases where the DMD 80 is located in an oblique orientation, the pitch of scanning loci (i.e., the sub-scanning lines) along the sub-scanning direction, which are formed with the laser beams having been reflected from the micromirrors 81, 81, . . . of the DMD 80, is capable of being set at a small pitch P2. The pitch P2 is smaller than a pitch P1 obtained in cases where the DMD 80 is located in an orientation, which is not oblique, as illustrated in FIG. 18A. With the setting of the inclination of the DMD 80, the resolution of exposure with the exposure head 166 is capable of being enhanced markedly.

Also, since an identical region of the photosensitive material 150 on the sub-scanning line is capable of being subjected to multiple exposure with different micromirrors 81, 81, . . . , the exposed position is capable of being controlled finely, and a high-definition exposure operation is capable of being performed. Further, joints of the two-dimensional patterns, which are formed with the exposure to the laser beams radiated out from the exposure heads 166, 166, . . . adjacent to one another with respect to the main scanning direction, are capable of being rendered imperceptible.

DMD Irradiation Optical System 70

As illustrated in FIG. 2, the DMD irradiation optical system 70 of each of the exposure heads 166, 166, . . . comprises a collimator lens 71 for approximately collimating the plurality of the laser beams, which have been radiated out from the laser beam radiating section 61 of the light source unit 60, as a whole. The DMD irradiation optical system 70 also comprises a micro fry-eye lens 72, which is located in the optical path of the light having passed through the collimator lens 71. The DMD irradiation optical system 70 further comprises a micro fry-eye lens 73, which is located so as to stand facing the micro fry-eye lens 72. The DMD irradiation optical system 70 still further comprises a field lens 74, which is located on the radiating side of the micro fry-eye lens 73, i.e. on the side facing the mirror 75 described later. The DMD irradiation optical system 70 also comprises the prism 76.

Each of the micro fry-eye lens 72 and the micro fry-eye lens 73 comprises a plurality of fine lens cells, which are arrayed in two-dimensional directions. The laser beams having passed through the fine lens cells impinge in an overlapping state upon the DMD 80 via the mirror 75 and the prism 76. Therefore, the distribution of the intensities of the laser beams impinging upon the DMD 80 is capable of being rendered uniform. Alternatively, in lieu of each of the micro fry-eye lens 72 and the micro fry-eye lens 73, a rod integrator may be utilized.

The mirror 75 reflects the laser beams having passed through the field lens 74. Also, the prism 76 is the TIR prism (the total reflection prism) and totally reflects the laser beams, which have been reflected from the mirror 75, toward the DMD 80. In the manner described above, the DMD irradiation optical system 70 irradiates the laser beams, which have the approximately uniform intensity distribution, onto the DMD 80.

Explanation of the Operation of the Projecting Exposure Apparatus

How the aforesaid projecting exposure apparatus operates will be described hereinbelow.

The projecting exposure apparatus is actuated, and the respective sections of the projecting exposure apparatus are set in an operating state. In this state, the temperature of the laser beam combining light sources 40, 40, . . . of each of the exposure heads 166, 166, . . . is adjusted. However, the GaN type semiconductor lasers LD1 to LD7 of each of the laser beam combining light sources 40, 40, . . . are not turned on.

The image signal corresponding to the two-dimensional pattern is fed into the controller (not shown), which is connected to the DMD 80 of each of the exposure heads 166, 166, . . . The image signal is stored in a frame memory of the controller. The image signal represents the image densities of the pixels constituting the image. By way of example, the image signal may represent the image density of each pixel by the binary notation (representing whether a dot is to be or is not to be recorded).

The stage 152 having the surface, on which the photosensitive material 150 has been supported by suction, is moved by the actuating section (not shown) at a predetermined speed from the side more upstream than the scanner support section 160 to the side more downstream than the scanner support section 160 along the guides 158, 158 and under the scanner support section 160. At the time at which the stage 152 passes under the scanner support section 160, the leading end of the photosensitive material 150 is detected by the detection sensors 164, 164, which are secured to the scanner support section 160. After the leading end of the photosensitive material 150 has been detected by the detection sensors 164, 164, the image signal components of the image signal, which has been stored in the frame memory of the controller, are successively read from the frame memory in units of a plurality of scanning lines. In accordance with the thus read image signal components of the image signal, the signal processing section forms the control signal for each of the exposure heads 166, 166, . . .

When preparations for the exposure operation on the photosensitive material 150 has been made, the GaN type semiconductor lasers LD1 to LD7 of each of the laser beam combining light sources 40, 40, . . . of each of the exposure heads 166, 166, . . . are turned on. In accordance with the control signal having been formed by the signal processing section, each of the micromirrors 81, 81, . . . of the DMD 80 of each of the exposure heads 166, 166, . . . is controlled by the mirror actuation control section of the controller. The photosensitive material 150 is thus exposed to the laser beams.

When the laser beams, which have been produced by the laser beam combining light sources 40, 40, . . . and have been radiated out from the laser beam radiating section 61, are irradiated to the DMD 80 via the DMD irradiation optical system 70 in each of the exposure heads 166, 166, . . . , the laser beams are reflected from the micromirrors 81, 81, . . . of the DMD 80, which micromirrors are in the on state. The thus reflected laser beams pass through the optical system 50, and the images of the laser beams are formed on the photosensitive surface 151 of the photosensitive material 150. The images of the laser beams reflected from the micromirrors 81, 81, . . . of the DMD 80, which micromirrors are in the off state, are not formed on the photosensitive surface 151. Therefore, the photosensitive material 150 is not exposed to the laser beams reflected from the micromirrors 81, 81, . . . of the DMD 80, which micromirrors are in the off state.

In the manner described above, the laser beams, which have been radiated out from the light source unit 60 of each of the exposure heads 166, 166, . . . , are on-off modulated for each of the micromirrors 81, 81, . . . of the DMD 80 (i.e., for each of the pixels). As illustrated in FIG. 10 and FIGS. 11A, 11B, each of the exposure processing areas 168, 168, . . . on the photosensitive material 150 is subjected to the exposure processing performed by one of the exposure heads 166, 166, . . . Also, the photosensitive material 150 is moved in the sub-scanning direction together with the stage 152, and each of the band-shaped exposure-processed regions 170, 170, . . . extending in the sub-scanning direction is formed by one of the exposure heads 166, 166, . . .

Use of Part of the DMD 80

Figure 19A:
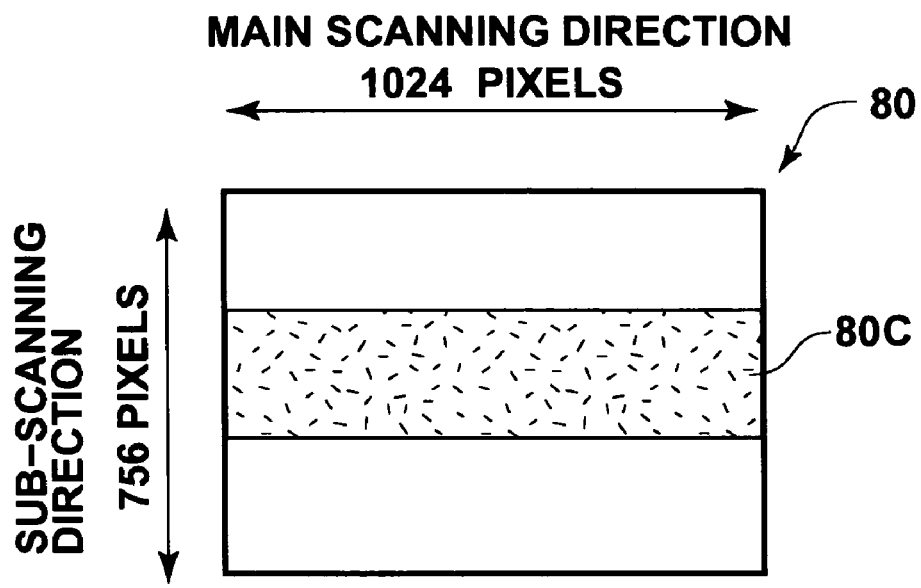
FIG. 19A is an explanatory view showing an example of a used region in the DMD.
Figure 19B:
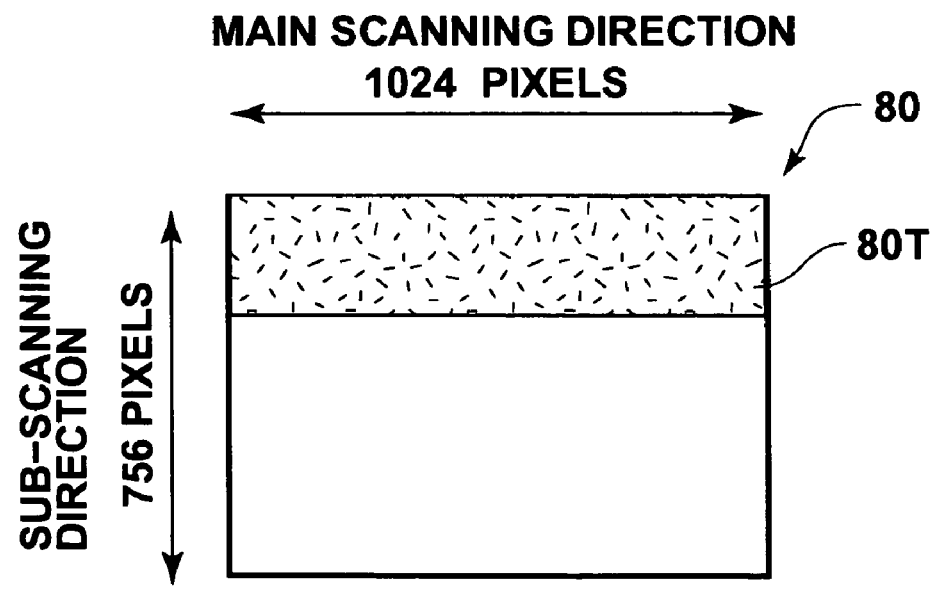
FIG. 19B is an explanatory view showing a different example of a used region in the DMD.
Figure 20:
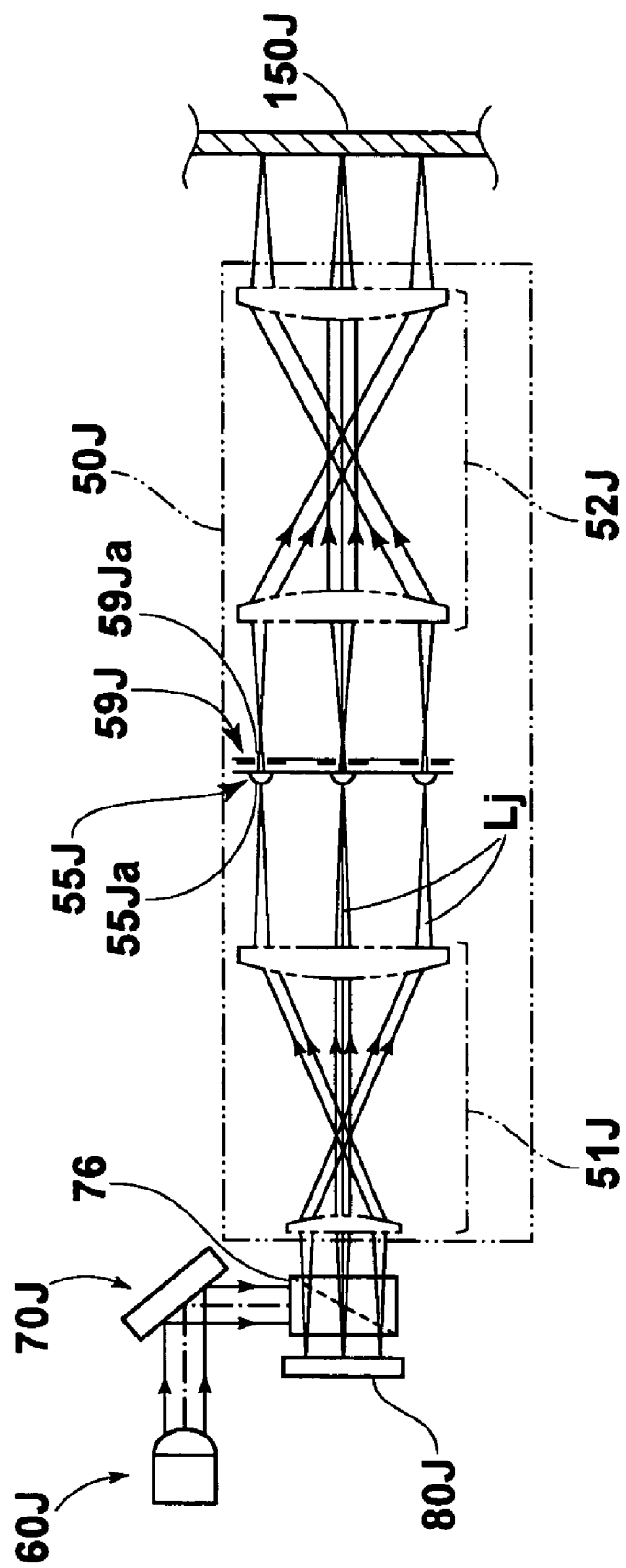
FIG. 20 is a side view showing optical elements constituting an exposure head in a conventional projecting exposure apparatus.

In this embodiment, as illustrated in FIGS. 19A and 19B, the DMD 80 comprises the array of the micromirrors 81, 81, . . . which array is composed of the plurality of (e.g., 1,024) columns (pixels) of the micromirrors 81, 81, . . . standing side by side with respect to the longitudinal direction of the DMD 80 (corresponding to the main scanning direction in the exposure operation) and a plurality of (e.g., 756) rows (pixels) of the micromirrors 81, 81, . . . standing side by side with respect to the lateral direction of the DMD 80 (corresponding to the sub-scanning direction in the exposure operation). However, in this embodiment, the controller controls such that only certain rows of the micromirrors 81, 81, . . . (e.g., 1,024 micromirrors×300 rows) are actuated.

For example, as illustrated in FIG. 19A, only the micromirrors 81, 81, . . . located in an array region 80C of the DMD 80, which array region is constituted of certain middle rows, may be actuated. Alternatively, as illustrated in FIG. 19B, only the micromirrors 81, 81, . . . located in an array region 80T of the DMD 80, which array region is constituted of certain rows at an end area, may be actuated. Also, in cases where a failure occurs with a certain micromirror 81, the micromirrors 81, 81, . . . located in an array region other than the array region containing the defective micromirror 81 may be utilized. In this manner, the array region of the DMD 80 to be used may be altered in accordance with the condition of the operation.

Specifically, limitation is imposed upon the signal processing speed for the DMD 80, and the modulation speed per scanning line is determined in proportion to the number of the micromirrors 81, 81, . . . to be controlled (i.e., the number of the pixels). Therefore, in cases where only the micromirrors 81, 81, . . . located within a certain part of the array region of the DMD 80 are used, the modulation speed per scanning line is capable of being kept high.

When the exposure operation performed in accordance with the image signal having been stored in the frame memory of the controller connected to the DMD 80 is finished, the GaN type semiconductor lasers LD1 to LD7 are turned off, and the radiating of the laser beams from the laser beam combining light sources 40, 40, . . . is ceased. Thereafter, the scanning operation performed by the scanner unit 162 for the photosensitive material 150 in the sub-scanning direction is finished, and the tail end of the photosensitive material 150 is detected by the detection sensors 164, 164. When the tail end of the photosensitive material 150 has thus been detected by the detection sensors 164, 164, the stage 152 is returned by the actuating section (not shown) along the guides 158, 158 to the original position, which is located at the most upstream side with respect to the scanner support section 160. In cases where the next exposure operation is to be performed, the stage 152 is again moved along the guides 158, 158 from the side more upstream than the scanner support section 160 to the side more downstream than the scanner support section 160.

The projecting exposure apparatus in accordance with the present invention is not limited to the cases where the DMD 80 is employed as the spatial light modulation means. The projecting exposure apparatus in accordance with the present invention may be constituted such that a micro electro mechanical systems (MEMS) type of spatial light modulator (SLM), an optical device for modulating light with electro-optic effects (a PLZT device), a liquid crystal shutter (FLC), or the like, is employed in lieu of the DMD 80. In such cases, as in the embodiment described above, the extinction ratio of the two-dimensional pattern projected onto the photosensitive material is capable of being enhanced, and the exposure quality is thus capable of being enhanced.

Further, with the projecting exposure apparatus in accordance with the present invention, no limitation is imposed upon the wavelengths of the light used for the exposure operation, and the exposure operation with light having wavelengths falling within various wavelength regions is capable of being performed. Furthermore, no limitation is imposed upon the technique for irradiating the light to the spatial light modulation means, the kind of the light source, or the like.

What is claimed is:

1. A projecting exposure apparatus, comprising:
    i) spatial light modulation means provided with a plurality of pixel sections arrayed in two-dimensional directions, which pixel sections modulate incident light in accordance with a predetermined control signal, the spatial light modulation means performing spatial light modulation of the light with the plurality of the pixel sections,
    ii) an image-side telecentric image forming optical system for forming an image of a two-dimensional pattern of the light, which has been obtained from the spatial light modulation performed by the spatial light modulation means, and
    iii) a microlens array located in the vicinity of a plane of image formation of the two-dimensional pattern, whose image is formed by the image-side telecentric image forming optical system, the microlens array being provided with a plurality of microlenses arrayed in two-dimensional directions, each of which microlenses transmits one of light beams corresponding respectively to the pixel sections of the spatial light modulation means and having passed through the image-side telecentric image forming optical system,
    the two-dimensional pattern of the light being projected onto the photosensitive material, the photosensitive material being thus exposed to the two-dimensional pattern of the light,
    wherein the projecting exposure apparatus further comprises a magnification adjusting optical system, which is located between the image-side telecentric image forming optical system and the microlens array, and which adjusts a magnification of image formation at the time of the formation of the image of the two-dimensional pattern of the light with the image-side telecentric image forming optical system.

2. An apparatus as defined in claim 1 wherein the magnification adjusting optical system is constituted of a combination of a concave lens and a convex lens.

3. An apparatus as defined in claim 1 wherein the magnification adjusting optical system is constituted of a combination of a concave lens and a convex lens, and
    each of a focal length of the concave lens and a focal length of the convex lens is equal to at least 800 mm.

4. An apparatus as defined in claim 2 wherein a value of a ratio of a focal length of the convex lens to a focal length of the concave lens is equal to approximately 1.

5. An apparatus as defined in claim 3 wherein a value of a ratio of the focal length of the convex lens to the focal length of the concave lens is equal to approximately 1.

6. An apparatus as defined in claim 1 wherein the magnification adjusting optical system also acts as a distortion correcting optical system for correcting a distortion occurring at the time of the formation of the image of the two-dimensional pattern of the light with the image-side telecentric image forming optical system.

7. An apparatus as defined in claim 2 wherein the magnification adjusting optical system also acts as a distortion correcting optical system for correcting a distortion occurring at the time of the formation of the image of the two-dimensional pattern of the light with the image-side telecentric image forming optical system.

8. An apparatus as defined in claim 3 wherein the magnification adjusting optical system also acts as a distortion correcting optical system for correcting a distortion occurring at the time of the formation of the image of the two-dimensional pattern of the light with the image-side telecentric image forming optical system.

9. An apparatus as defined in claim 4 wherein the magnification adjusting optical system also acts as a distortion correcting optical system for correcting a distortion occurring at the time of the formation of the image of the two-dimensional pattern of the light with the image-side telecentric image forming optical system.

10. An apparatus as defined in claim 5 wherein the magnification adjusting optical system also acts as a distortion correcting optical system for correcting a distortion occurring at the time of the formation of the image of the two-dimensional pattern of the light with the image-side telecentric image forming optical system.

\* \* \* \* \*